(12) United States Patent
Nakanishi et al.

(10) Patent No.: US 9,997,320 B2
(45) Date of Patent: Jun. 12, 2018

(54) METHOD OF MANUFACTURING A CIRCUIT BREAKER AND METHOD OF MANUFACTURING A BATTERY PACK INCLUDING THE CIRCUIT BREAKER

(71) Applicant: Otsuka Techno Corporation, Naruto-shi, Tokushima (JP)

(72) Inventors: Yoshihiro Nakanishi, Naruto (JP); Shiro Shibuya, Okayama (JP); Kazuo Tanabe, Kobe (JP)

(73) Assignee: OTSUKA TECHNO CORPORATION, Naruto-Shi, Tokushima (JP)

( * ) Notice: Subject to any disclaimer, the term of this patent is extended or adjusted under 35 U.S.C. 154(b) by 0 days. days.

(21) Appl. No.: 15/323,127

(22) PCT Filed: Oct. 21, 2015

(86) PCT No.: PCT/JP2015/079649
§ 371 (c)(1),
(2) Date: Dec. 30, 2016

(87) PCT Pub. No.: WO2016/098441
PCT Pub. Date: Jun. 23, 2016

(65) Prior Publication Data
US 2017/0169978 A1    Jun. 15, 2017

(30) Foreign Application Priority Data

Dec. 17, 2014  (JP) .................................. 2014-255339

(51) Int. Cl.
*H01H 11/00*  (2006.01)
*H01H 65/00*  (2006.01)
(Continued)

(52) U.S. Cl.
CPC ........ *H01H 71/0207* (2013.01); *H01H 71/16* (2013.01); *H01H 83/223* (2013.01);
(Continued)

(58) Field of Classification Search
CPC ............... H01H 71/16; H01H 71/7436; H01H 37/5418; H01H 71/0207; H01H 83/223; Y10T 29/49105
(Continued)

(56) References Cited

U.S. PATENT DOCUMENTS 4,843,363 A     6/1989  Ubukata et al.
6,407,552 B1 *  6/2002  Newland ............ G01R 31/3277
                                               209/538
(Continued)

FOREIGN PATENT DOCUMENTS

JP      S56-159016 A    12/1981
JP      H01-105435 A    4/1989
(Continued)

OTHER PUBLICATIONS

International Search Report dated Dec. 22, 2015 for PCT/JP2015/079649.

*Primary Examiner* — Thiem Phan
(74) *Attorney, Agent, or Firm* — Pearne & Gordon LLP

(57) ABSTRACT

The circuit breaker is fabricated by an assembly step that makes a circuit breaker assembly with a moving contact metal plate, stationary contact metal plate, and bimetallic strip disposed in prescribed locations in an external case; and an anneal step that introduces the circuit breaker assembly made in the assembly step into an anneal oven, heats the circuit breaker assembly in the anneal oven and then cools it to anneal both the moving contact metal plate and the bimetallic strip and produce a heat-treated circuit breaker.

20 Claims, 22 Drawing Sheets

(51) Int. Cl.
*H01H 71/02* (2006.01)
*H01H 71/16* (2006.01)
*H01H 83/22* (2006.01)
*H01L 23/00* (2006.01)
*H05K 3/34* (2006.01)
*H01H 71/00* (2006.01)

(52) U.S. Cl.
CPC ............... *H01L 24/26* (2013.01); *H05K 3/34* (2013.01); *H01H 2071/004* (2013.01); *Y10T 29/49105* (2015.01)

(58) Field of Classification Search
USPC ......... 29/622, 407.05, 428, 593, 623, 623.1, 29/825
See application file for complete search history.

(56) References Cited

U.S. PATENT DOCUMENTS

| | | | |
|---|---|---|---|
| 8,289,124 B2 * | 10/2012 | Hofsaess | ............ H01H 37/5427 337/333 |
| 2002/0060898 A1 | 5/2002 | Nagai et al. | |
| 2012/0299690 A1 | 11/2012 | Nakanishi et al. | |
| 2016/0086753 A1 | 3/2016 | Mochizuki et al. | |

FOREIGN PATENT DOCUMENTS

| | | |
|---|---|---|
| JP | 2000-215751 A | 8/2000 |
| JP | 2002-056755 A | 2/2002 |
| JP | 2013-098098 A | 5/2013 |
| WO | 2014/171515 A1 | 10/2014 |

* cited by examiner

METHOD OF MANUFACTURING A CIRCUIT BREAKER AND METHOD OF MANUFACTURING A BATTERY PACK INCLUDING THE CIRCUIT BREAKER

BACKGROUND OF THE INVENTION

1. Field of the Invention

The present invention relates to a circuit breaker primarily housed in electrical equipment such as a battery pack to cut-off current flow when temperature becomes greater than a preset value.

2. Description of the Related Art

The safety level of battery packs and apparatus such as electric motors can be improved by cutting-off current flow in abnormally high-temperature conditions. This can be implemented by using a circuit breaker that disconnects (switches OFF) contact connection at a set temperature. For example, since abnormal charging and discharging of a battery pack housing lithium ion batteries can result in battery heating, a circuit breaker is included as a protection device to cut-off current flow at high-temperature allowing the battery pack to be used safely. In addition, since temperature can become abnormally high when a device such as a motor is overloaded and/or passes excessive current, that current can be cut-off via a circuit breaker to protect the motor and allow it to be used safely.

Targeting these types of applications, a circuit breaker has been developed that detects temperature rise with a bimetallic strip and separates a moving contact from a stationary contact to break connection and switch the circuit breaker OFF (JP 2002-56755 A).

The cited circuit breaker is shown in the cross-section views of FIGS. 1 and 2. FIG. 1 shows the bimetallic strip 108 in the concave downward (under-cambered) state, where the moving contact 107 is connected to the stationary contact 105 to put the circuit breaker in the ON-state. FIG. 2 shows curvature reversal of the bimetallic strip 108, which becomes concave upward to disconnect the moving contact 107 from the stationary contact 105 and put the circuit breaker in the OFF-state.

See also WO2014/171515A1.

When a set temperature is exceeded in the circuit breaker shown in FIGS. 1 and 2, curvature of the bimetallic strip 108 reverses (becomes concave upward) to push the moving contact metal plate 106 upward and separate the moving contact 107 from the stationary contact 105 putting the circuit breaker in the OFF state to cut-off current flow. When temperature is reduced and the bimetallic strip 108 returns to its original (concave downward) shape, spring-behavior of the resiliently bent moving contact metal plate 106 returns the moving contact 107 to the ON-state in contact with the stationary contact 105. When the moving contact metal plate 106 is not pushed upward by the bimetallic strip 108, namely when the curvature of the concave downward bimetallic strip 108 is not reversed by high-temperature, the moving contact metal plate 106 resiliently presses the moving contact 107 against the stationary contact 105. Specifically, under these conditions, the moving contact 107 is held in contact with the stationary contact 105 by the spring-loaded resilient characteristics of the moving contact metal plate 106 keeping the circuit breaker in the ON-state.

As described above, a circuit breaker, which switches to the OFF state when bimetallic strip curvature reverses and has the moving contact metal plate pressing resiliently against the stationary contact in the ON-state, switches according to the characteristics shown in FIG. 3. Specifically, the circuit breaker shown in FIG. 3 switches from the ON-state to the OFF state to cut-off current flow in the unsafe condition where temperature rises to the OFF-temperature (Ta), and resets to the ON-state allowing safe operation to be resumed when temperature drops to the ON-temperature (Tb). Accordingly, this circuit breaker is ideally suited for use in apparatus such as a battery pack. Note that a fuse can also be used as a protection device in the same manner as a circuit breaker to cut-off current flow under high-temperature conditions. However, a fuse cannot reset to the ON-state once it has cut-off current flow (blown) at a high-temperature. Consequently, it has the drawback that use as a protection device in a battery pack does not allow operation to be resumed after high-temperature excursion even when temperature drops to levels allowing safe battery pack operation.

In a circuit breaker that resets to the ON-state allowing operation to be resumed when temperature drops after current cut-off at a high-temperature, it is important to keep the ON-temperature (Tb), where the circuit breaker resets to the ON-state, within a given range. However, as shown by the broken-lines in FIG. 3, when a related-art circuit breaker is exposed to high-temperature, elasticity degradation in the moving contact metal plate results in a lower ON-temperature (Tb') and a larger temperature difference (Ta−Tb') between the OFF-temperature (Ta) for current cut-off and the ON-temperature (Tb') for reset. Specifically, this related art circuit breaker has the drawbacks that hysteresis increases in the switching temperature characteristics, a consistent ON-temperature (Tb') cannot be maintained, and ON-temperature (Tb') variation increases. Non-uniform degradation in moving contact metal plate elasticity and inconsistent ON-temperature reduction are due to uneven reduction in the spring back force resiliently pressing the bimetallic strip towards the reset (ON) position. When temperature drops after high-temperature excursion, the bimetallic strip recovers from reversed (concave upward) curvature to its normal (concave downward) shape. During that recovery, the moving contact metal plate resiliently applies pressure (spring back force) on the bimetallic strip promoting its return to the normal (concave downward) state. However, when the resilient spring back force of the moving contact metal plate decreases non-uniformly, the bimetallic strip cannot quickly recover to the ON-state at a given temperature and ON-temperature decreases in an inconsistent manner. Detrimental effects can result from inconsistent reduction in the reset ON-temperature. For example, when temperature drops after high-temperature excursion in a battery, the circuit breaker can maintain current cut-off preventing battery operation even after temperature has dropped to a value allowing battery use.

During the assembly of equipment using a circuit breaker, the circuit breaker is exposed to a thermal environment during process steps such as solder reflow. A related-art circuit breaker with a phosphor bronze moving contact metal plate has the drawback that after thermal exposure such as solder reflow, the switching temperature for reset to the ON-state from the OFF-state, namely the ON-temperature (Tb'), is reduced in an inconsistent manner and the temperature difference (Ta−Tb') from the ON-temperature (Ta) is increased (also in an inconsistent manner). A circuit breaker with inconsistently reduced ON-temperature (Tb') and increased hysterises may not be able to reset to the ON-state after switching to the OFF-state at high-temperature even though temperature has dropped to values allowing safe operation. This circuit breaker cannot be used conveniently in various thermal environments. The ON-temperature of a circuit breaker that has switched to the OFF-state can be increased by increasing the OFF-temperature for current cut-off. However, if the OFF-temperature is increased in a circuit breaker with large hysterises, the circuit breaker provided as a protection device, for example in a battery application, has the negative feature that it is unable to ensure battery safety at high-temperature. This is because the circuit breaker is unable to cut-off current even when battery temperature increases to a high value where current should be cut-off.

Incidentally, to reduce variation in the bimetallic strip activation temperature for circuit breaker switching, a manufacturing method that includes bimetallic strip heat-treatment during assembly has been developed (See WO2014/171515A1).

The circuit breaker cited in this patent publication uses a bimetallic strip heat-treated at a temperature 30° C. to 100° C. higher than the temperature of the solder reflow oven. This can reduce shift in bimetallic strip activation temperature for circuit breaker contact switching even after high-temperature exposure such as after circuit board solder-attachment in the reflow oven. This is because once the bimetallic strip has been heat-treated; the temperature for curvature reversal does not change even when exposed to a high-temperature environment. In this circuit breaker, the activation temperature for bimetallic strip curvature reversal to switch the moving contact to the OFF-state does not shift.

However, the circuit breaker described above cannot maintain a constant temperature for returning the bimetallic strip to normal (concave downward) curvature and switching the contacts to the ON-state, and also cannot keep the temperature for switching (resetting) to the ON-state within a given range. This is because the temperature for resetting the OFF-state circuit breaker back to the ON-state depends not only on bimetallic strip characteristics, but also on interaction between the bimetallic strip and restoring pressure applied by the moving contact metal plate. To reduce and stabilize contact resistance (R) in the ON-state, the moving contact resiliently applies pressure on the stationary contact. For example, for a small circuit breaker installed in a battery pack, contact resistance (R) can be restrained to several mΩ by application of 20 g to 30 g of pressure with the moving contact on the stationary contact. However, if moving contact pressure drops to half that value, contact resistance (R) will increase drastically on the order of tens of mΩ. For this reason, conditions are established to maintain resilient pressure on the stationary contact with the moving contact metal plate. Under these conditions, after bimetallic strip curvature reversal and switching to the OFF-state, the bimetallic strip is resiliently pressed toward the (downward curvature) reset direction by the moving contact metal plate. Consequently, if the elastic restoring force of the moving contact metal plate decreases and less pressure is applied (in the reset direction) on the curvature reversed bimetallic strip, temperature for returning the bimetallic strip to its normal (downward curvature) is lowered. Therefore, while a circuit breaker housing a heat-treated bimetallic strip can maintain a constant activation temperature to reverse curvature and switch the contacts to the OFF-state in a high-temperature condition, it has the drawback that it cannot maintain the reset temperature within a given temperature range to switch the contacts back to the ON-state after the bimetallic strip has reversed curvature and switched the contacts to the OFF-state.

It is one object of the present invention to provide a circuit breaker fabrication method and method of manufacturing a battery pack housing that circuit breaker that can minimize shift in the temperature for reset to the ON-state after switching to the OFF-state in a high-temperature environment. Another important object of the present invention to provide a circuit breaker fabrication method and method of manufacturing a battery pack housing that circuit breaker that can prevent high-temperature induced hysterises increase due to ON-temperature reduction, and can reliably cut-off current when protection device temperature rises abnormally while rapidly resetting to the ON-state when temperature drops to values allowing operation.

SUMMARY OF THE INVENTION

The circuit breaker fabrication method of the present invention fabricates a circuit breaker provided with a stationary contact metal plate 4 having a stationary contact 5; a moving contact metal plate 6 that is a flexible metal plate, which has a moving contact 7 disposed in a position opposite the stationary contact 5, and which resiliently presses the moving contact 7 against the stationary contact 5; a bimetallic strip 8 that changes shape with temperature and is disposed in a position to switch the moving contact metal plate 6 ON and OFF; and an external case 1 that houses the stationary contact 5 on the stationary contact metal plate 4 and the moving contact 7 on the moving contact metal plate 6 and also contains the bimetallic strip 8. The circuit breaker fabrication method has an assembly step to make a circuit breaker assembly 70 with the moving contact metal plate 6, the stationary contact metal plate 4, and the bimetallic strip 8 disposed in prescribed locations within the external case 1; and an anneal step that introduces the circuit breaker assembly 70 made in the assembly step into an anneal oven 80, heats the circuit breaker assembly 70 in the anneal oven 80 and subsequently cools the circuit breaker assembly 70 to anneal both the moving contact metal plate 6 and the bimetallic strip 8 and produce a heat-treated circuit breaker 71.

The circuit breaker fabricated by the method described above has the characteristic that variation can be reduced in the temperature for reset to the ON-state after exposure to a heating environment such as the solder reflow process. This is because the fabrication method does not heat-treat the bimetallic strip alone as in related-art methods. Instead, the circuit breaker assembly, which houses the bimetallic strip and moving contact metal plate, is heated as an assembled unit in an anneal oven and subsequently cooled to anneal both the bimetallic strip and moving contact metal plate in the anneal step. The moving contact metal plate annealed in the assembled state becomes more robust (stronger) after anneal and cooling, can reduce the size of the temperature distribution for reset to the ON-state, and can make the amount of reset temperature reduction smaller. Accordingly, for circuit breakers fabricated as described above, there are essentially no circuit breakers with reset temperature shift greater than or equal to 10° C. after a solder reflow process step that heats the circuit breakers with a maximum temperature from 240° C. to 260° C. for a maximum of 10 sec. In contrast, approximately 50% of un-annealed (related-art) circuit breakers have reset temperature shift greater than or equal to 10° C. after the solder reflow process.

Consequently, the circuit breaker described above has the characteristic that it can prevent increased reset temperature variation (temperature distribution widening) after exposure to a heating environment such as solder reflow, and can rapidly reset to the ON-state to quickly resume operation when temperature drops to an operable value after reliable current cut-off due to abnormal temperature rise in the protected equipment.

Note that the circuit breaker described above is not assembled after heat-treating the bimetallic strip alone as in related-art. Instead, heat-treatment is conducted in the assembled state to anneal both the bimetallic strip and the moving contact metal plate. Specifically, since this circuit breaker is heated and cooled as an assembled unit, the entire assembly of components is annealed with the bimetallic strip, stationary contact metal plate, and moving contact metal plate installed in their prescribed locations. In this manner, circuit breaker assembly annealing treats not only the bimetallic strip, but also the moving contact metal plate and external case as a whole. Namely, the circuit breaker is annealed in its final functional configuration. Consequently, by post-anneal test selection of only circuit breakers that switch to the OFF-state and reset to the ON-state within prescribed temperature ranges, extremely precise temperatures can be established for OFF-state switching and ON-state reset with subsequent thermal excursions such as solder reflow.

The fabrication method of the present invention can produce a circuit breaker that uses flexible metal plate Cu—Ni—Si system alloy including Mg and Cr as the moving contact metal plate 6. A circuit breaker fabricated by this method is characterized by still smaller temperature reduction and temperature variation for switching to the OFF-state and resetting to the ON-state.

The fabrication method of the present invention can produce a circuit breaker that uses flexible copper metal plate material including Sn and P as the moving contact metal plate 6. A circuit breaker fabricated by this method has the characteristic that it can be annealed to reduce the amount of temperature lowering in reset switching to the ON-state.

The fabrication method of the present invention can produce a circuit breaker that uses flexible copper metal plate material including Ni, P, Zn, and Fe as the moving contact metal plate 6. A circuit breaker fabricated by this method has the characteristic that it can be annealed to reduce the amount of temperature lowering in reset switching to the ON-state.

The fabrication method of the present invention can produce a circuit breaker that uses flexible copper metal plate material including Fe, P, and Zn as the moving contact metal plate 6. A circuit breaker fabricated by this method has the characteristic that it can be annealed to reduce the amount of temperature lowering in reset switching to the ON-state.

The circuit breaker fabrication method of the present invention can anneal the circuit breaker assembly 70 in the anneal oven 80 with a temperature greater than or equal to 180° C. and less than or equal to 270° C. in the anneal step. Since the anneal step heats the entire circuit breaker assembly, the reset temperature of a circuit breaker fabricated by this method can be appropriately controlled and the number of circuit breakers rejected at the anneal step can be reduced.

The circuit breaker fabrication method of the present invention can specify the change in reset temperature after the anneal step, which heats the circuit breaker assembly 70 in the anneal oven 80 for 5 sec to 60 sec with temperature from 180° C. to 270° C., to be within 5° C. and preferably within 4° C. Since annealing in the anneal step of this fabrication method is performed at heating temperatures that produce a circuit breaker with reset temperature change within 5° C. and preferably within 4° C., reset temperature difference in the fabricated circuit breakers can be made small.

The anneal step of the circuit breaker fabrication method of the present invention can heat the circuit breaker assembly 70 in the anneal oven 80 in an oxidizing atmosphere. Since this fabrication method heats the circuit breaker assembly in an oxidizing atmosphere in the anneal step, annealing can be performed in a simple anneal oven.

In the anneal step of the circuit breaker fabrication method of the present invention, the circuit breaker assembly 70 can be heated in the anneal oven 80 in an oxidizing atmosphere, and heating can be at a temperature that forms an oxide layer on surfaces of the moving contact metal plate 6. Since this fabrication method forms an oxide layer on moving contact metal plate surfaces, the moving contact metal plate is strengthened, and reset temperature variation can be reduced while using a simple anneal oven.

In the circuit breaker fabrication method of the present invention, an external metal plate 3 having an (externally) exposed surface can be established in the external case 1, the external metal plate 3 can be attached with surface-to-surface contact in a thermally coupled manner to the moving contact metal plate 6 in the assembly step, and the anneal oven 80 can heat the moving contact metal plate 6 via the external metal plate 3 when the circuit breaker assembly 70 is annealed in the anneal step. Since this fabrication method heats and anneals the moving contact metal plate via the external metal plate having an exposed surface, the moving contact metal plate can be efficiently annealed by thermal connection to the external metal plate within the thermal environment of the anneal oven. This is because the external metal plate is efficiently heated in the thermal environment of the anneal oven and the heated external metal plate in-turn heats and anneals the moving contact metal plate.

The method of manufacturing a battery pack of the present invention has an assembly step to form a circuit breaker assembly 70 having a stationary contact metal plate 4 with a stationary contact 5, a moving contact metal plate 6 that is a flexible metal plate, which has a moving contact 7 disposed in a position opposite the stationary contact 5, and which resiliently presses the moving contact 7 against the stationary contact 5, a bimetallic strip 8 disposed in a position to switch the moving contact metal plate 6 ON and OFF, and an external case 1 that houses those components and disposes the stationary contact 5 on the stationary contact metal plate 4 and bimetallic strip 8 in fixed positions; an anneal step that introduces the circuit breaker assembly 70 made in the assembly step into an anneal oven 80, heats the circuit breaker assembly 70 to anneal both the moving contact metal plate 6 and the bimetallic strip 8 and produce a heat-treated circuit breaker 71; a solder reflow step that places the heat-treated circuit breaker 71 in a prescribed location on a circuit board 60, and solder-attaches the heat-treated circuit breaker 71 to the circuit board 60 in a solder reflow oven 85; and an electrical connection step to electrically connect the circuit board 60 and heat-treated circuit breaker 71 attached in solder reflow step to a battery or batteries 72 to make a battery pack.

The method of manufacture described above has the characteristic that a battery pack can be assembled using a circuit breaker with little variation in the reset temperature for switching to the ON-state after exposure to a high-temperature environment such as solder reflow. This is because the method of manufacture does not heat-treat the bimetallic strip alone as in related-art methods. Instead, the circuit breaker assembly, which houses the bimetallic strip and moving contact metal plate, is heated as an assembled unit in an anneal oven and subsequently cooled to anneal both the bimetallic strip and moving contact metal plate in the anneal step. The moving contact metal plate annealed in the assembled state is (actively) cooled or left in a room temperature ambient, and even after subsequent temperature excursions such as solder reflow, temperature for reset to the ON-state is kept within a tight distribution with little reset temperature reduction. Accordingly, for circuit breakers described here, there are essentially no circuit breakers with reset temperature shift greater than or equal to 10° C. after a solder reflow process step that heats the circuit breakers with a maximum temperature from 240° C. to 260° C. for a maximum of 10 sec. In contrast, approximately 50% of un-annealed (related-art) circuit breakers have reset temperature shift greater than or equal to 50° C. after the solder reflow process.

Consequently, a battery pack housing the circuit breaker described above has the characteristic that there is no widening of the reset temperature distribution after exposure to a heating environment such as solder reflow, and after reliable current cut-off due to abnormal temperature rise, the circuit breaker can rapidly reset to the ON-state to quickly resume operation when temperature drops to an operable temperature.

Note that the circuit breaker installed in the battery pack described above is not assembled after heat-treating the bimetallic strip alone as in related-art. Instead, heat-treatment is conducted in the assembled state to anneal both the bimetallic strip and the moving contact metal plate. Specifically, since this circuit breaker is heated and cooled as an assembled unit, the entire assembly of components is annealed with the bimetallic strip, stationary contact metal plate, and moving contact metal plate installed in their prescribed locations. In this manner, circuit breaker assembly annealing treats not only the bimetallic strip, but also the moving contact metal plate and external case as a whole. Namely, the circuit breaker is annealed in its final functional configuration. Consequently, by post-anneal test selection of only circuit breakers that switch to the OFF-state and reset to the ON-state within prescribed temperature ranges, a circuit breaker characterized by extremely precise reset temperature even after subsequent thermal excursions can be assembled in the battery pack.

The method of manufacturing a battery pack of the present invention can use flexible metal plate Cu—Ni—Si system alloy including Mg and Cr as the moving contact metal plate 6 in the circuit breaker.

The method of manufacturing a battery pack of the present invention can use flexible copper metal plate material including Sn and P as the moving contact metal plate 6 in the circuit breaker.

The method of manufacturing a battery pack of the present invention can use flexible copper metal plate material including Ni, P, Zn, and Fe as the moving contact metal plate 6 in the circuit breaker.

The method of manufacturing a battery pack of the present invention can use flexible copper metal plate material including Fe, P, and Zn as the moving contact metal plate 6 in the circuit breaker.

The method of manufacturing a battery pack of the present invention can set the anneal temperature for heating the circuit breaker assembly 70 in the anneal oven 80 during the anneal step to a value lower than the temperature of the solder reflow oven 85. In this case, quenching stress relief, as well as prevention of shift with aging and improved abrasion resistance can be realized.

The method of manufacturing a battery pack of the present invention can anneal the circuit breaker assembly 70 in the anneal oven 80 with a temperature greater than or equal to 180° C. and less than or equal to 270° C. in the anneal step.

The method of manufacturing a battery pack of the present invention can specify the change in reset temperature after the anneal step, which heats the circuit breaker assembly 70 in the anneal oven 80 for 5 sec to 60 sec with temperature from 180° C. to 270° C., to be within 5° C. and preferably within 4° C.

DESCRIPTION OF THE EMBODIMENTS

Figure 1:
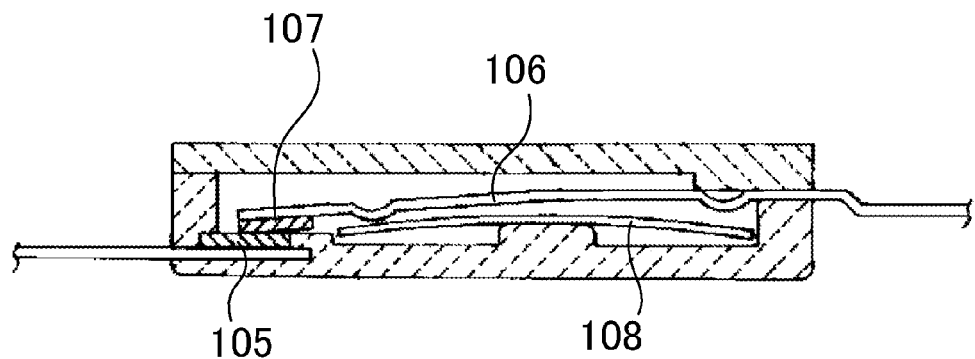
FIG. 1 is a cross-section view showing a related-art circuit breaker in the ON-state.
Figure 2:
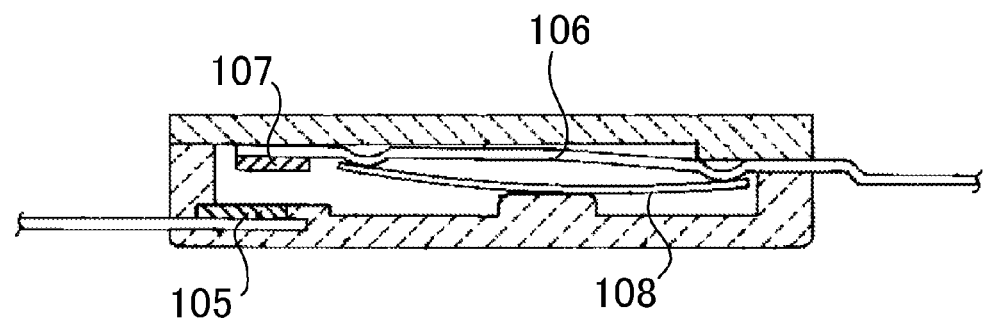
FIG. 2 is a cross-section view showing the circuit breaker in FIG. 1 in the OFF-state.
Figure 3:
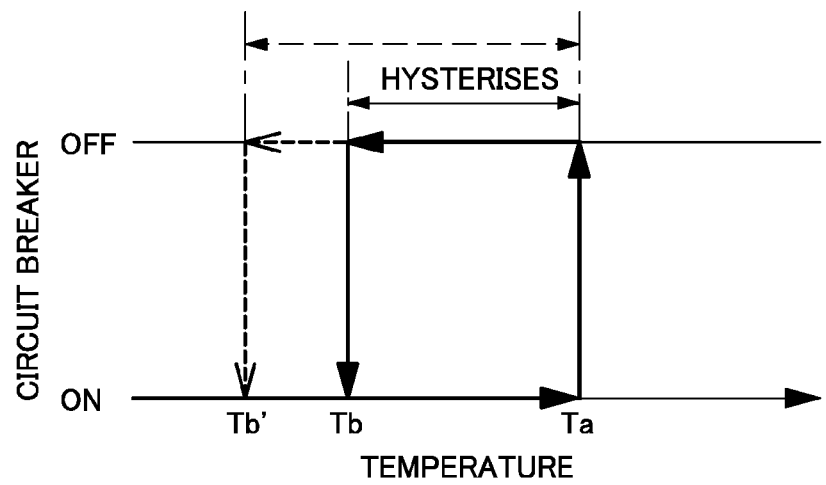
FIG. 3 is a diagram showing change in the ON-reset temperature after high-temperature exposure.

The following describes embodiments of the present invention based on the figures. However, each of the following embodiments is merely a specific example of the circuit breaker fabrication method and method of manufacturing a battery pack housing that circuit breaker representative of the technology associated with the present invention, and the circuit breaker fabrication method and method of manufacturing a battery pack housing that circuit breaker of the present invention is not limited to the embodiments described below. Further, to make the scope of the claims easy to understand, reference numbers (signs) are assigned to embodiment components described in the "Claims" and "Solution to the Problem and Advantageous Effects of the Invention" sections. However, components described in the claims are in no way limited to the components in the embodiments.

The circuit breaker described below is housed in a battery pack and its bimetallic strip changes shape to cut-off current when battery temperature or ambient temperature becomes high, or when the battery pack is used under abnormal conditions. However, applications of the circuit breaker of the present invention are not limited and the circuit breaker can be used in any application (such as in a motor) to detect temperature rise and cut-off current.

The circuit breaker shown in FIGS. 4-9 is provided with a stationary contact metal plate 4 having a stationary contact 5, a moving contact metal plate 6 having a moving contact 7 disposed in a position opposite the stationary contact 5, a bimetallic strip 8 disposed in a position to switch the moving contact metal plate 6 ON and OFF, and an external case 1 that houses the stationary contact 5 on the stationary contact metal plate 4 and the moving contact 7 on the moving contact metal plate 6 and also contains the bimetallic strip 8. When the surrounding temperature of this circuit breaker rises to a high-temperature, that temperature rise is detected by shape-change in the bimetallic strip 8. Shape-change in the bimetallic strip 8 causes the moving contact metal plate 6 to distort (bend) and separate the moving contact 7 from the stationary contact 5 switching the contacts to the OFF-state. Further, when the surrounding temperature drops to a given value, the moving contact metal plate 6 and bimetallic strip 8 return to their original shapes and positions to put the moving contact in contact with the stationary contact and switch to the ON-state.

The circuit breaker shown in FIGS. 4-9 retains the stationary contact metal plate 4 and moving contact metal plate 6, and houses the bimetallic strip 8, which bends the moving contact metal plate, and a heater 9 that heats the bimetallic strip 8. Since the circuit breaker in the figures houses a heater 9 that heats the bimetallic strip 8, it is optimally suited for applications that sustain current cut-off by heating the bimetallic strip 8 through the heater 9. However, the circuit breaker does not necessarily have to contain a heater.

The external case 1 is formed from a plastic insulating case 2 and external metal plate 3. The insulating case 2 has the stationary contact metal plate 4 insertion-molded into its base region 13, and has the external metal plate 3 attached to its upper surface. The end regions of the insulating case 2 are provided with a first end-wall 11A and a second end-wall 11B and retaining space 20 is established between the first and second end-walls 11A, 11B. The bottom of the retaining space 20 is closed-off by the insertion-molded stationary contact metal plate 4 and the top is closed-off by the external metal plate 3. Accordingly, the stationary contact metal plate 4 is exposed from the bottom surface of the external case 1, and the external metal plate 3 is exposed from the upper surface of the external case 1. The external metal plate 3 is not insertion-molded into the plastic insulating case 2 and is essentially exposed in its entirety on the upper surface of the external case 1.

The insulating case 2 is provided with opposing side-walls 12 established on both sides of the retaining space 20 and connecting the first and second end-walls 11A, 11B. The side-walls 12 and end-walls 11 form outer-walls 10 that surround the retaining space 20. Accordingly, the retaining space 20 is surrounded by the outer-walls 10, has its bottom surface closed-off by the stationary contact metal plate 4, and has its upper surface closed-off by the external metal plate 3 establishing a closed-off hollow region.

Figure 5:
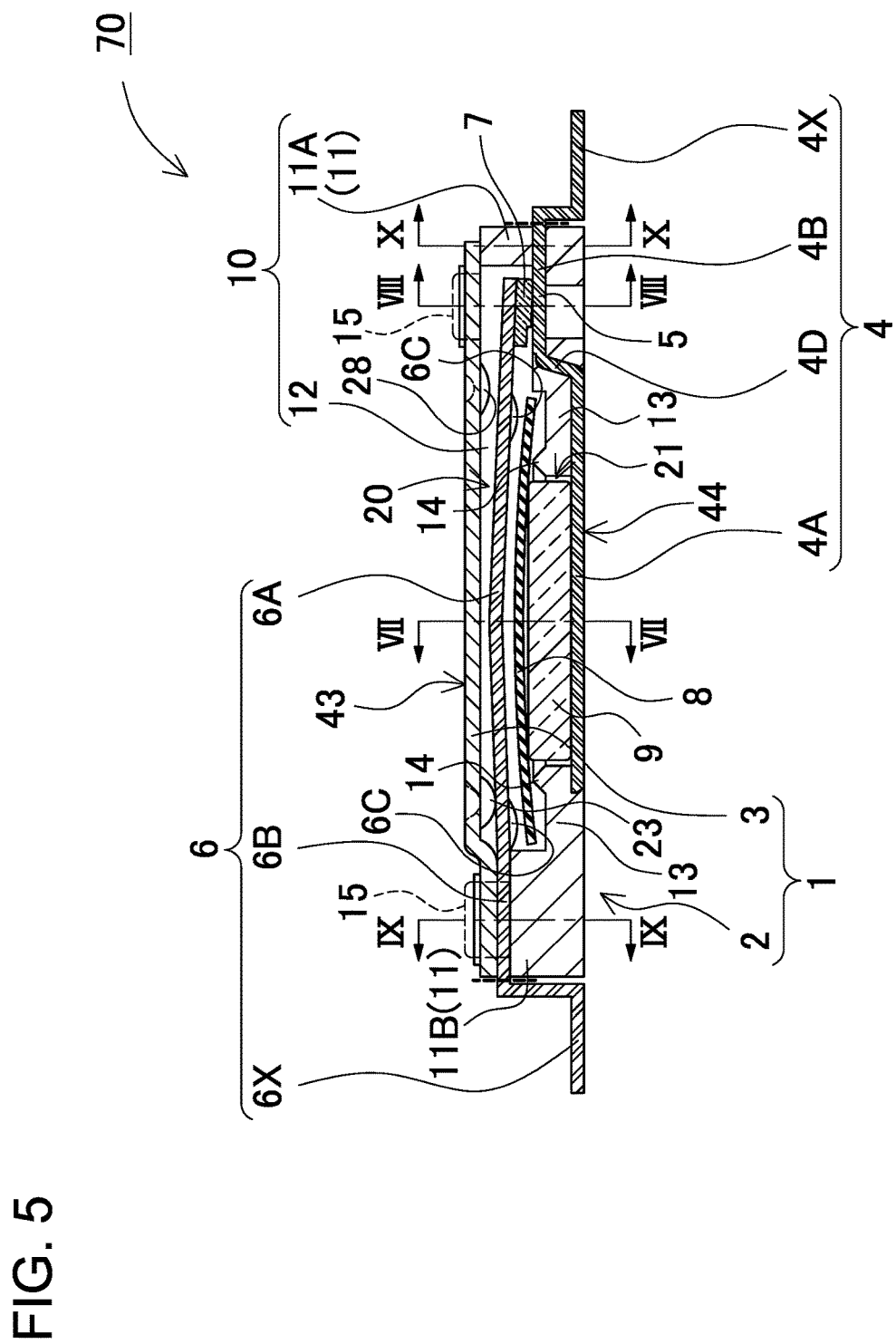
FIG. 5 is a vertical cross-section in the lengthwise direction through the circuit breaker shown in FIG. 4.
Figure 6:
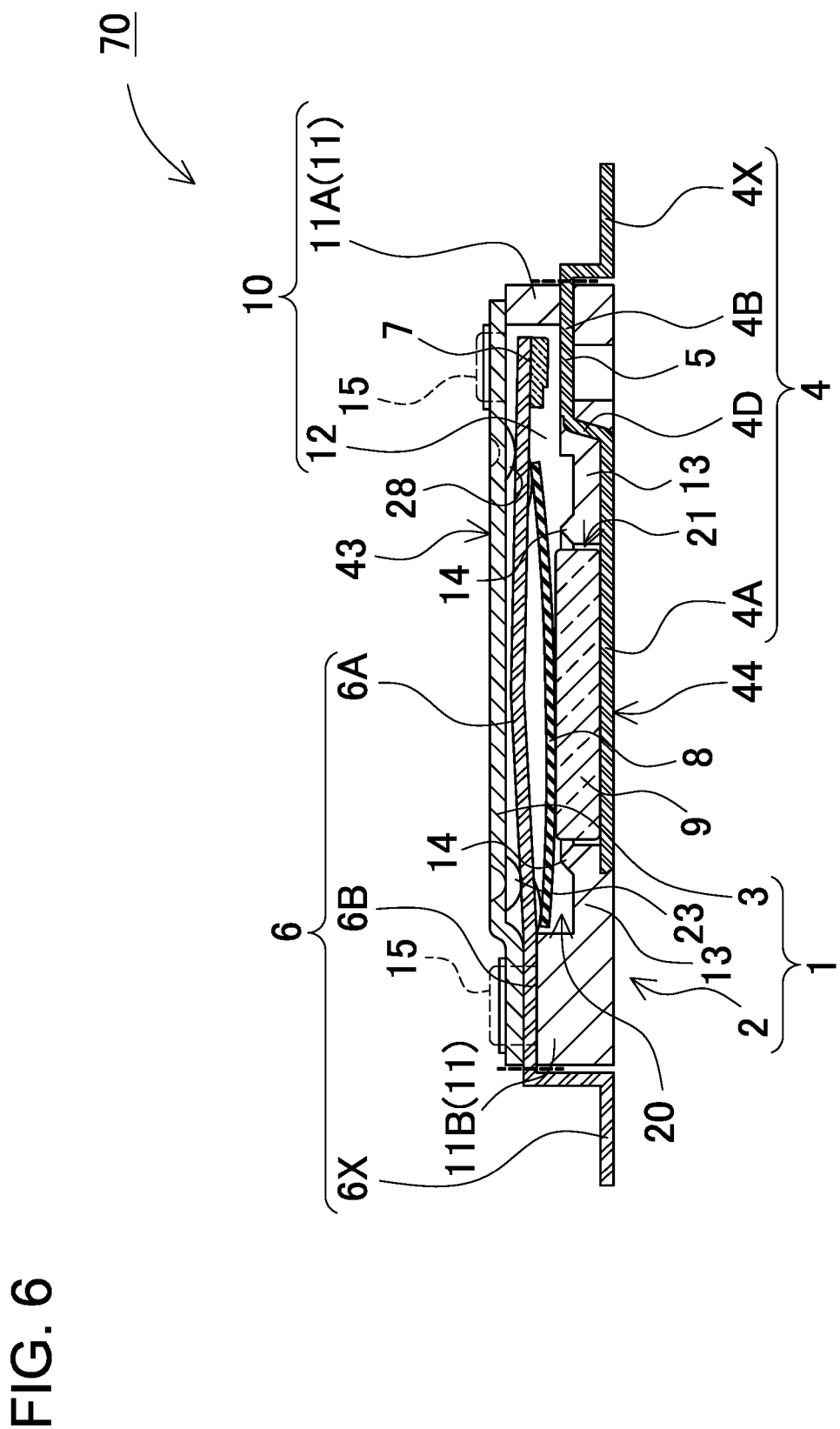
FIG. 6 is a cross-section view showing the circuit breaker in FIG. 5 in the OFF-state.

The insulating case 2 in FIGS. 5 and 6 has the center section 4B of the stationary contact metal plate 4 partially embedded (by insertion-molding) in the first end-wall 11A. Consequently, the stationary contact metal plate 4 is fixed in the insulating case 2 and passes through the first end-wall 11A. Part of the stationary contact metal plate 4 exposed inside the retaining space 20 serves as the stationary contact 5, and the section that extends outside the insulating case 2 serves as a connecting terminal 4X.

The connecting terminal 4X of the stationary contact metal plate 4 is bent to allow solder-attachment to the surface of a circuit board by a method such as solder reflow. Specifically, the end of the stationary contact metal plate 4 extending outside the external case 1 is bent to put its attachment surface (bottom surface in FIGS. 5 and 6) essentially in the same plane as the bottom of the external case 1, which is the bottom surface of the insulating case 2. This circuit breaker is placed on a circuit board with the connecting terminal 4X aligned on a solder-pad, and heated for attachment by solder reflow. However, the region of the stationary contact metal plate 4 exposed from the bottom surface of the insulating case 2 can serve as an externally exposed terminal 44, and circuit board attachment can also be implemented by solder reflow with the exposed terminal 44 on a solder-pad. This circuit breaker can be solder-attached (e.g. to a circuit board) using the exposed terminal 44 of the stationary contact metal plate 4, and does not necessarily need a connecting terminal 4X extending out the end of the external case 1.

The insulating case 2 has the non-moving section 6B of the moving contact metal plate 6 fixed to its second end-wall 11B. In the current cut-off type circuit breaker shown in FIGS. 5 and 6, the non-moving section 6B of the moving contact metal plate 6 is attached to the upper surface of second end-wall 11B. The moving contact metal plate 6 is bond-attached to the top of the second end-wall 11B, or is held fixed on top of the second end-wall 11B via the external metal plate 3. The external case 1 of the figures has one end of the external metal plate 3 stacked over and in contact with the non-moving section 6B of the moving contact metal plate 6 holding it in place on the insulating case 2. Since this structure attaches the external metal plate 3 in a stack directly contacting the moving contact metal plate 6, overall circuit breaker size can be kept thin.

Figure 7:
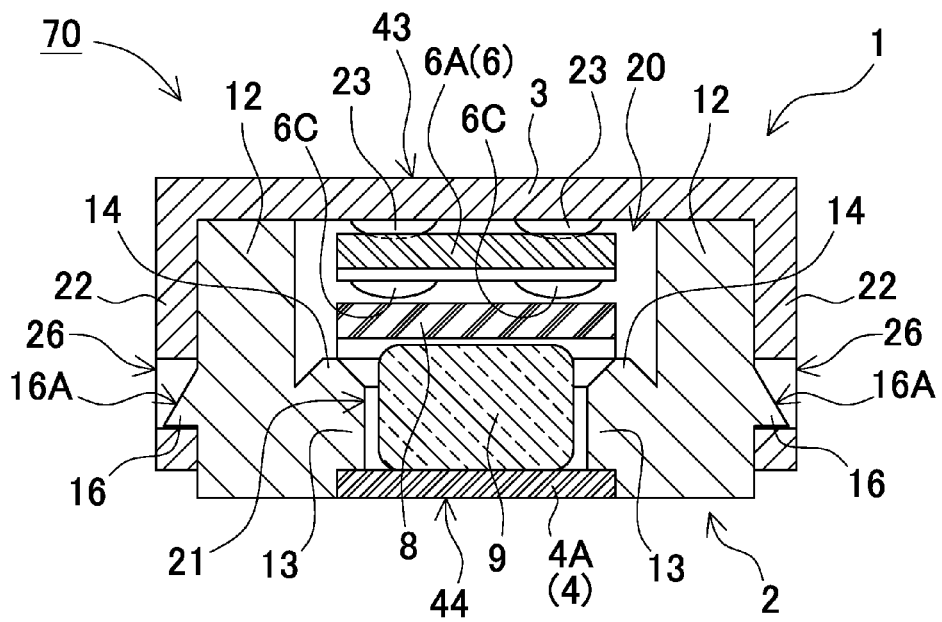
FIG. 7 is a cross-section view at the line VII-VII on the circuit breaker shown in FIG. 5.

The insulating case 2 shown in the cross-sections of FIGS. 5-7 has an insertion cavity 21 established in the retaining space 20 to hold the heater 9. The insertion cavity 21 is established in the center region of the retaining space 20 and the bottom of the cavity is closed-off by the inward end 4A of the stationary contact metal plate 4. To allow heater 9 insertion, the insertion cavity 21 is made with an outline incrementally larger than that of the heater 9. A protruding region 14 is also established immediately around the insertion cavity 21. The heater 9 is inserted in the insertion cavity 21 with its upper surface extending slightly above the top of the protruding region, and the curved bimetallic strip 8 rides on top of the heater 9 in a thermally coupled manner.

The retaining space 20 has the bottom of the insertion cavity 21 closed-off via the stationary contact metal plate 4, and has the region surrounding the insertion cavity 21 closed-off by insulating case 2 plastic. The stationary contact metal plate 4 is insertion-molded and fixed within the base region 13 plastic of the insulating case 2 that closes-off the bottom of the retaining space 20 around the insertion cavity 21.

The external metal plate 3 that closes-off the top of the retaining space 20 is not insertion-molded, but rather has both end regions attached to the top of the insulating case 2 end-walls 11. The current cut-off type circuit breaker in FIGS. 4-6 has the ends of the external metal plate 3 attached to the top of the first end-wall 11A and the top of the second end-wall 11B. The external metal plate 3 is fixed to the insulating case 2 via fastening ribs 15 molded in single-piece configuration with the first and second end-walls 11A, 11B. As shown by broken lines in FIGS. 5 and 6, the insulating case 2 is provided with fastening ribs 15, which protrude from the upper surfaces of the end-walls 11, to attach the external metal plate 3. The external metal plate 3 is provided with through-holes 25 to accept the fastening ribs 15, and the external metal plate 3 is attached to the insulating case 2 by inserting the fastening ribs 15 through the through-holes 25. With the fastening ribs 15 inserted through the through-holes 25, the tops of the fastening ribs 25 are squashed-down with heat and pressure or ultrasound to reliably secure the external metal plate 3 on top of the end-walls 11 on the upper surface of the insulating case 2. This structure allows the external metal plate 3 to be positively attached in a simple manner in a precise location on the insulating case 2. However, the external metal plate can also be bond-attached to the top of the insulating case. Through-holes are also provided in an external metal plate that is bond-attached to insulating case. In this case, fastening ribs established on top of the insulating case end-walls are inserted into the through-holes to bond-attach the external metal plate in a reliably position-aligned manner.

Figure 8:
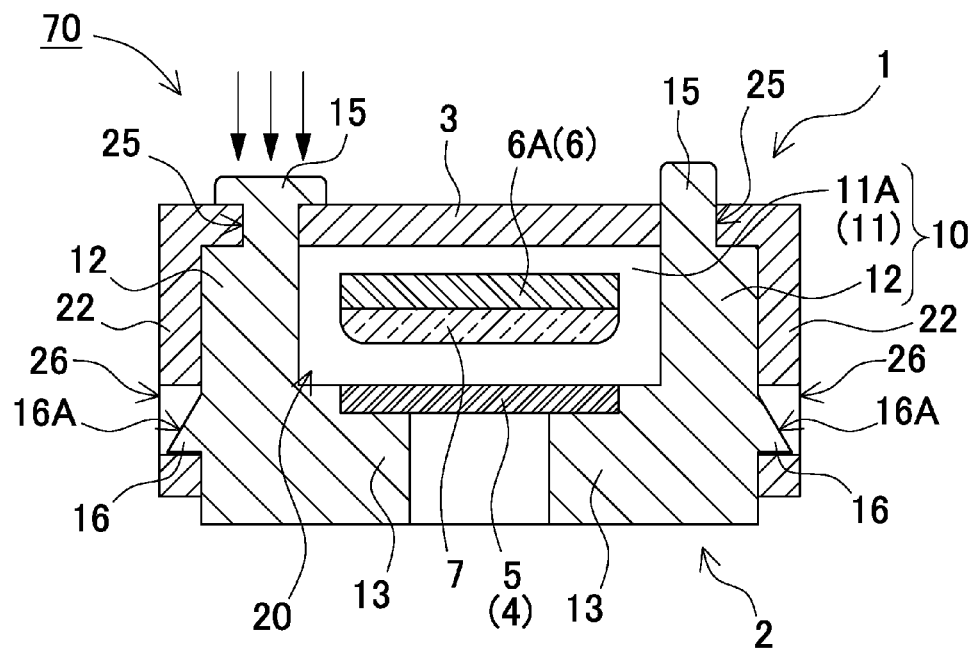
FIG. 8 is a cross-section view at the line VIII-VIII across the circuit breaker shown in FIG. 5.
Figure 9:
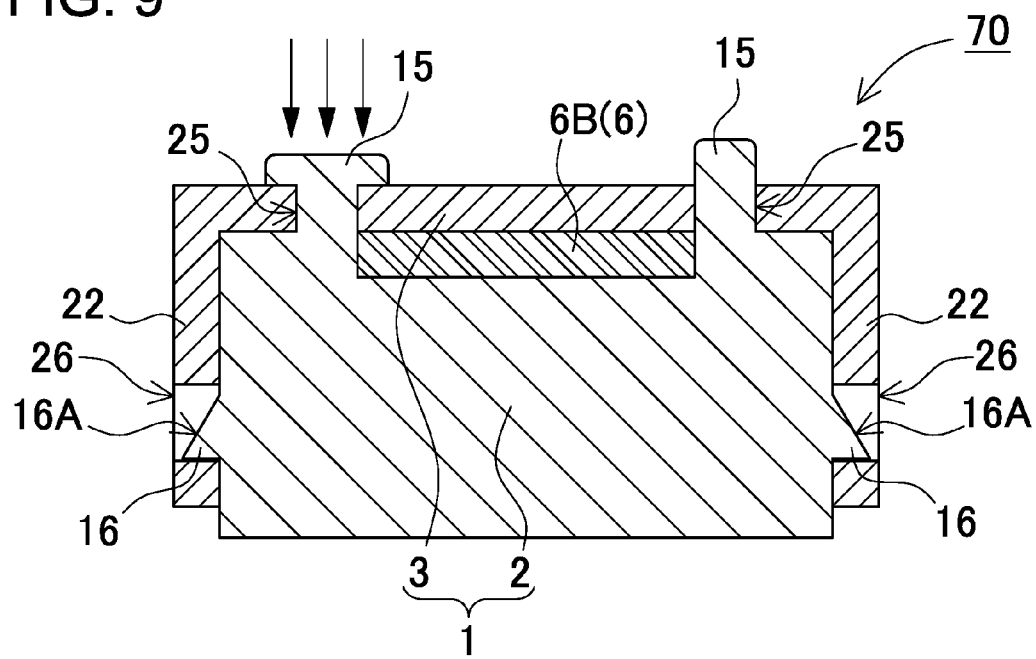
FIG. 9 is a cross-section view at the line IX-IX across the circuit breaker shown in FIG. 5.

Through-holes 25 are established in the four corners of the external metal plate 3 and fastening ribs 15 that pass through each of the through-holes 25 are established on the upper surfaces of the end-walls 11 of the insulating case 2. FIG. 8 is a cross-section showing external metal plate 3 attachment to the first end-wall 11A, and FIG. 9 is a cross-section showing external metal plate 3 attachment to the second end-wall 11B. The first end-wall 11A shown in FIG. 8 has fastening ribs 15 established in a manner protruding from the upper surfaces of the side-walls 12 on opposing sides of the retaining space 20. Fastening ribs 15 are formed in the shape illustrated in the right-hand side of the figure, and as shown in the left-hand side of the figure, each fastening rib 15 passes through a through-hole 25 and is squashed-down from the top to hold the external metal plate 3 in place. Although fastening ribs 15 are established on top of the side-walls 12 on opposing sides of the retaining space 20 at the first end-wall 11A shown in FIG. 8, a single fastening rib 15 can also be formed on top of the first end-wall 11A as shown in the cross-section of FIG. 10, which is through the line X-X in FIG. 5. In addition, as shown in the cross-section of FIG. 11, which is through the line VII-VII in FIG. 5, fastening ribs 15 can also be established protruding from the upper surfaces of the side-walls 12 in that region, through-holes 25 can be established in the external metal plate 3 to accept those fastening ribs 15, and the center region of the external metal plate 3 can be attached to the insulating case 2.

The external metal plate 3 shown in the cross-sections of FIGS. 7-9 is provided with metal plate side-walls 22 that are bent to conform to the outer surfaces of the insulating case 2 side-walls 12, and those metal plate side-walls 22 interlock with the insulating case 2 side-walls 12. In the interlocking configuration of the figures, locking projections 16 are formed protruding outward from the side-walls 12, and locking holes 26 to accept the locking projections 16 are established in the metal plate side-walls 22. The locking projections 16 have an inclined surface 16A that gradually increases projection height in the metal plate side-wall 22 attachment direction and allows the locking projections 16 to be smoothly guided into the locking holes 26.

Figure 10:
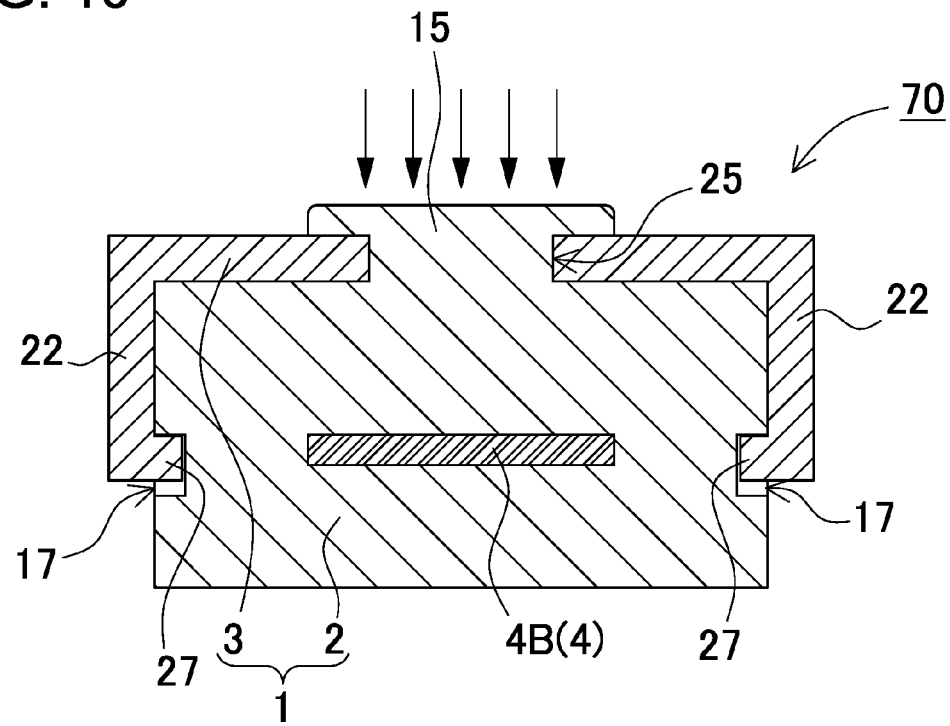
FIG. 10 is a cross-section view showing an alternate connecting rib configuration, and corresponds to a cross-section at the line X-X across the circuit breaker shown in FIG. 5.

Alternatively in the interlocking configuration of FIG. 10, the ends of the metal plate side-walls 22 are bent inward to form locking hooks 27. Locking grooves 17 are formed in the outer surfaces of the insulating case 2 side-walls 12 to accept the locking hooks 27, and the external metal plate 3 attaches to the insulating case 2 in an interlocked manner by locking hook 27 insertion in the locking grooves 17.

Figure 11:
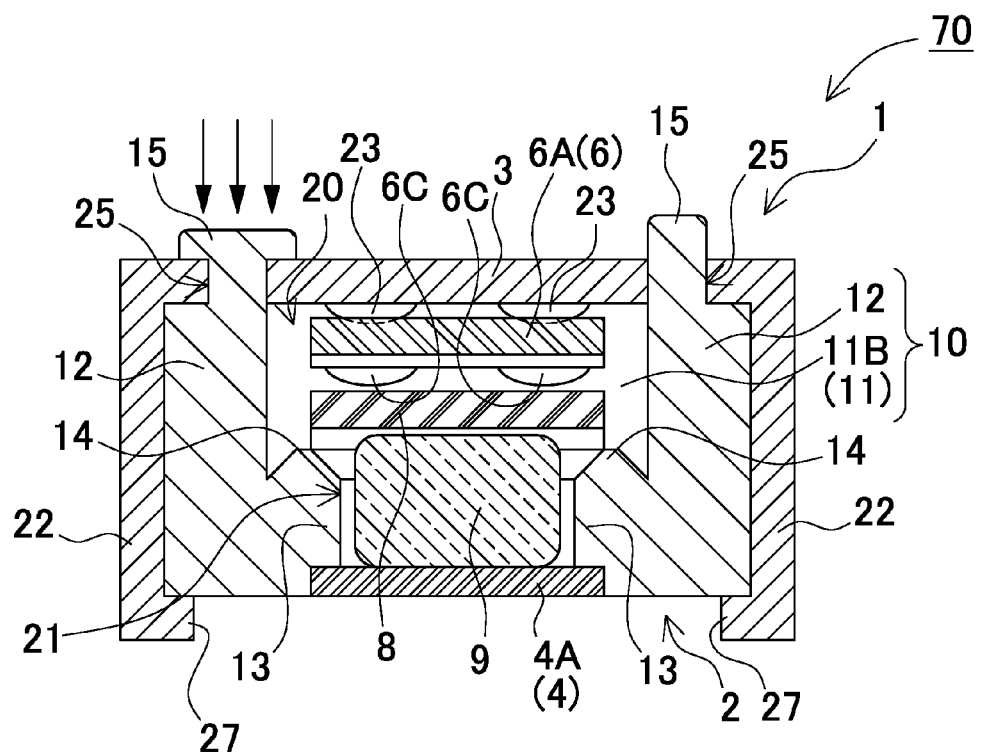
FIG. 11 is a cross-section view showing an alternate connecting rib configuration, and corresponds to a cross-section at the line VII-VII across the circuit breaker shown in FIG. 5.

Further in the interlocking configuration of FIG. 11, the ends of the metal plate side-walls 22 are again bent inward to form locking hooks 27. In this case, the locking hooks 27 latch on the bottom surfaces of the side-walls 12 to attach the external metal plate 3 to the insulating case 2 in an interlocking configuration. In these types of interlocking structures, the metal plate side-walls 22 bend resiliently during interlock fastening (snap-on), and in the interlocked state, elastic restoring force of the metal plate side-walls 22 maintains the locking projections 16 or locking hooks 27 in a latched position in the locking holes 26 or locking grooves 17, or around the bottom surfaces of the insulating case 2 side-walls 12.

Surfaces of the external metal plate 3 are provided with an insulating layer (not illustrated). The insulating layer is applied as a film coating on the surfaces of the external metal plate 3. However, the insulating layer can also be established by covering the external metal plate with insulating sheet. Since the external metal plate 3 of a current cut-off type circuit breaker can be insulated via an insulating layer, the circuit breaker can be housed in equipment in a manner contacting that equipment.

The insulating case 2 retaining space 20 contains, in order from the bottom surface, the heater 9, the bimetallic strip 8, and the movable section 6A of the moving contact metal plate 6. At the first end-wall 11A of the insulating case 2, the center section 4B of the stationary contact metal plate 4 is embedded and held in the insulating case 2. At the second end-wall 11B, the non-moving section 6B of the moving contact metal plate 6 is attached to the insulating case 2.

The stationary contact metal plate 4 is fixed in the insulating case 2 by insertion-molding. Insertion-molding embeds the inward end 4A of the stationary contact metal plate 4 in the base region 13 below the retaining space 20, and embeds the center section 4B in the base region 13 and the first end-wall 11A of the insulating case 2. The stationary contact metal plate 4 in FIGS. 5 and 6 is provided with a step section 4D that makes the region embedded in the first end-wall 11A higher than the region that closes-off the bottom of the insertion cavity 21. The step section 4D is embedded in the base region 13 of the insulating case 2 and its upper end is exposed from the top of the base region 13 as part of the stationary contact 5.

The heater 9 generates heat due to electrical conduction and heats the bimetallic strip 8. The heater 9 is a positive temperature coefficient (PCT) heater having some thickness, elliptical or rectangular sides, and electrodes on the top and bottom surfaces. However, the heater is not necessarily a PCT heater and any heater material that can conduct and heat the bimetallic strip 8 can be used. A heater 9 with electrodes established on its top and bottom surfaces can have its bottom surface in contact with the stationary contact metal plate 4 and its upper surface in contact with the moving contact metal plate 6 via the bimetallic strip 8. In the ON-state with the moving contact 7 in contact with the stationary contact 5, the moving contact metal plate 6 and bimetallic strip 8 do not touch and the heater 9 does not conduct. However, in the OFF-state with the moving contact 7 separated from the stationary contact 5, the heater 9 conducts (and heats the bimetallic strip 8) by contact with the stationary contact metal plate 4 and the moving contact metal plate 6 through the bimetallic strip 8. As shown in FIG. 6, the heated bimetallic strip 8 holds the moving contact 7 away from the stationary contact 5 in the OFF-state. Since this current cut-off type circuit breaker holds the moving contact 7 in the OFF-state when it has switched OFF, the battery pack can be used safely. This is because after exceeding the set (circuit breaker tripping) temperature and switching to the OFF-state due to operation of the battery pack under abnormal conditions, the heater 9 continues to conduct with battery power, and the bimetallic strip 8 is heated. Accordingly, the circuit breaker does not reset to the ON-state, and the current cut-off state is maintained until the batteries discharge. However, the circuit breaker is not limited to a configuration housing a heater. When the set temperature is exceeded in a circuit breaker that does not contain a heater, the bimetallic strip changes shape and bends the moving contact metal plate to switch the contacts to the OFF-state, but the bimetallic strip is not heated to maintain the OFF condition. Consequently, when bimetallic strip temperature drops to given value, the bimetallic strip and moving contact metal plate return to their original disposition and switch the circuit breaker to the ON-state.

To implement shape change with heating, the bimetallic strip 8 is a laminate of metals having different coefficients of thermal expansion. The bimetallic strip 8 is disposed between the heater 9 and the moving contact metal plate 6, reverses curvature with heating, and separates the moving contact 7 from the stationary contact 5 to switch the circuit breaker to the OFF-state. The bimetallic strip 8 has a curved shape with protruding center region. As shown in FIG. 5, when heating has not changed the shape of the bimetallic strip 8 and the moving contact 7 is in contact with the stationary contact 5, the protruding center region protrudes towards the moving contact metal plate 6 (concave downward). As shown in FIG. 6, when heating has reversed the curvature of the bimetallic strip 8, the protruding center region protrudes towards the heater 9 (concave upward). As shown in FIG. 6, in the heated curvature-reversed state, the protruding center region of the bimetallic strip 8 contacts the heater 9 and both ends press upward on the movable section 6A of the moving contact metal plate 6. This pushes the movable section 6A upward to separate the moving contact 7 from the stationary contact 5 and put the circuit breaker in the OFF-state.

As shown in FIGS. 5 and 6, the non-moving section 6B of the moving contact metal plate 6 is attached on top of the second end-wall 11B, the movable section 6A is disposed inside the retaining space 20, and the other end of the moving contact metal plate 6 extends outside the external case 1 to serve as a connecting terminal 6X. The non-moving section 6B of the moving contact metal plate 6 is fixed to the top of the second end-wall 11B via bond-attachment. Further, as shown in FIGS. 5, 6, and 9, the non-moving section 6B is held in place by sandwiching it between the external metal plate 3 and the top of the second end-wall 11B. The current cut-off type circuit breaker shown in the figures has one end of the external metal plate 3 stacked in contact with the non-moving section 6B of the moving contact metal plate 6. Accordingly, the external metal plate 3 can also be used as a contact connected to the moving contact metal plate 6. However, the external metal plate can also be stacked on the moving contact metal plate in an insulated configuration.

The movable section 6A of the moving contact metal plate 6, which is disposed inside the retaining space 20, is a flexible metal plate that can distort in a resilient manner. The moving contact metal plate 6 is a Cu—Ni—Si system alloy that includes Mg and Cr. The Cu—Ni—Si alloy includes 1.0 to 4.5 mass % Ni and preferably 2.0 to 2.8 mass % Ni, and 0.2 to 1.5 mass % Si and preferably 0.45 to 0.8 mass % Si in a Cu base material. The Cu—Ni—Si alloy also includes 0.02 to 0.4 mass % Mg and preferably 0.05 to 0.2 mass % Mg, and 0.02 to 1 mass % Cr and preferably 0.05 to 0.2 mass % Cr. Further, The Cu—Ni—Si alloy can also include 0.1 to 0.8 mass % Sn and preferably 0.1 to 0.6 mass % Sn, and 0.1 to 1.5 mass % Zn and preferably 0.3 to 0.7 mass % Zn. However, the moving contact metal plate of the present invention is not limited to Cu—Ni—Si system alloys. For example, flexible metal plate such as copper material that includes Sn and P, copper material that includes Ni, P, Zn, and Fe, or copper material that includes Fe, P, and Zn can also be used for the moving contact metal plate.

The moving contact metal plate 6 has a moving contact 7 established at the end of the movable section 6A on the surface opposite the stationary contact 5. When the shape of the bimetallic strip 8 has not been altered by heating, the moving contact 7 of the moving contact metal plate 6 contacts the stationary contact 5 in the ON-state. When the shape of the bimetallic strip 8 has changed (reversed curvature) due to heating, the movable section 6A of the moving contact metal plate 6 is pushed (upward) by the bimetallic strip 8 and elastically deformed (bent) separating the moving contact 7 from the stationary contact 5 in the OFF-state. In the current cut-off type circuit breaker shown in FIGS. 5 and 6, pressure bumps 23 are established protruding from the bottom surface of the external metal plate 3 to press downward on the aft end of the movable section 6A of the moving contact metal plate 6 and reliably hold the moving contact 7 in contact with the stationary contact 5 when the shape of the bimetallic strip 8 has not been altered by heating. Pressure applied to the aft end of the movable section 6A by the pressure bumps 23 spring-loads the contact end of the movable section 6A in a downward direction to reliably hold the moving contact 7 in contact with the stationary contact 5.

Further, the circuit breaker shown in FIGS. 5 and 6 has bend-limiting bumps 28 established on inside surface of the external metal plate 3. The bend-limiting bumps 28 press the moving contact metal plate 6 downward in the OFF-state when the shape of the bimetallic strip 8 has been altered by heating and the moving contact 7 separated from the stationary contact 5. The bend-limiting bumps 28 protrude at a position to press downward on the moving contact 7 end of the movable section 6A and limit the amount of movable section 6A bending due to pressure from the curvature reversed bimetallic strip 8. In the OFF-state, these bend-limiting bumps 28 press downward (towards the stationary contact 5) on the end region of the movable section 6A and limit the amount of deformation (bending) due to upward pressure from the curvature reversed bimetallic strip 8. Consequently, this structure prevents the curvature reversed bimetallic strip 8 from pushing the movable section 6A of the moving contact metal plate 6 upward to a degree that exceeds the elastic limit and degrades the spring characteristics of the movable section 6. Accordingly, a circuit breaker with this configuration has the feature that after reset to the ON-state, the moving contact 7 can press on the stationary contact 5 with a given pressure force and maintain low contact resistance.

The moving contact metal plate 6 of FIGS. 5-7 also has bimetallic strip contact bumps 6C established on its bottom surface, and these bimetallic strip contact bumps 6C make contact with both ends of the bimetallic strip 8 for mutual pressure application. The bimetallic strip contact bumps 6C of the figures have a circular arc shape, prevent the ends of the bimetallic strip 8 from sliding horizontally, and enable positive contact for mutual (bimetallic strip 6 to moving contact metal plate 6) pressure application. The moving contact metal plate 6 of the figures has a plurality of bimetallic strip contact bumps 6C established on its bottom surface opposite the end regions of the bimetallic strip 8. This structure allows reliable bimetallic strip 6 to moving contact metal plate 6 contact even when the bimetallic strip 8 is wide (laterally).

The end of the moving contact metal plate 6 connecting terminal 6X that extends outside the external case 1 is bent to position its connecting surface (bottom surface in FIGS. 5 and 6) in approximately the same plane as the bottom surface of the insulating case 2 to allow solder-attachment such as reflow solder-attachment to a circuit board. This circuit breaker is placed on a circuit board with the connecting terminal 6X disposed on a solder-pad and heated for reflow solder-attachment. Alternatively, the external metal plate 3 can be stacked in electrical contact with the moving contact metal plate 6, the exposed region of the external metal plate 3 can serve as an exposed terminal 43, and the exposed terminal 43 can be reflow solder-attached to a circuit board solder-pad. This circuit breaker does not necessarily need a connecting terminal 6X extending outside the external case 1, and the moving contact metal plate 6 can be connected to a surface such as that of a circuit board via the external metal plate 3.

Figure 4:
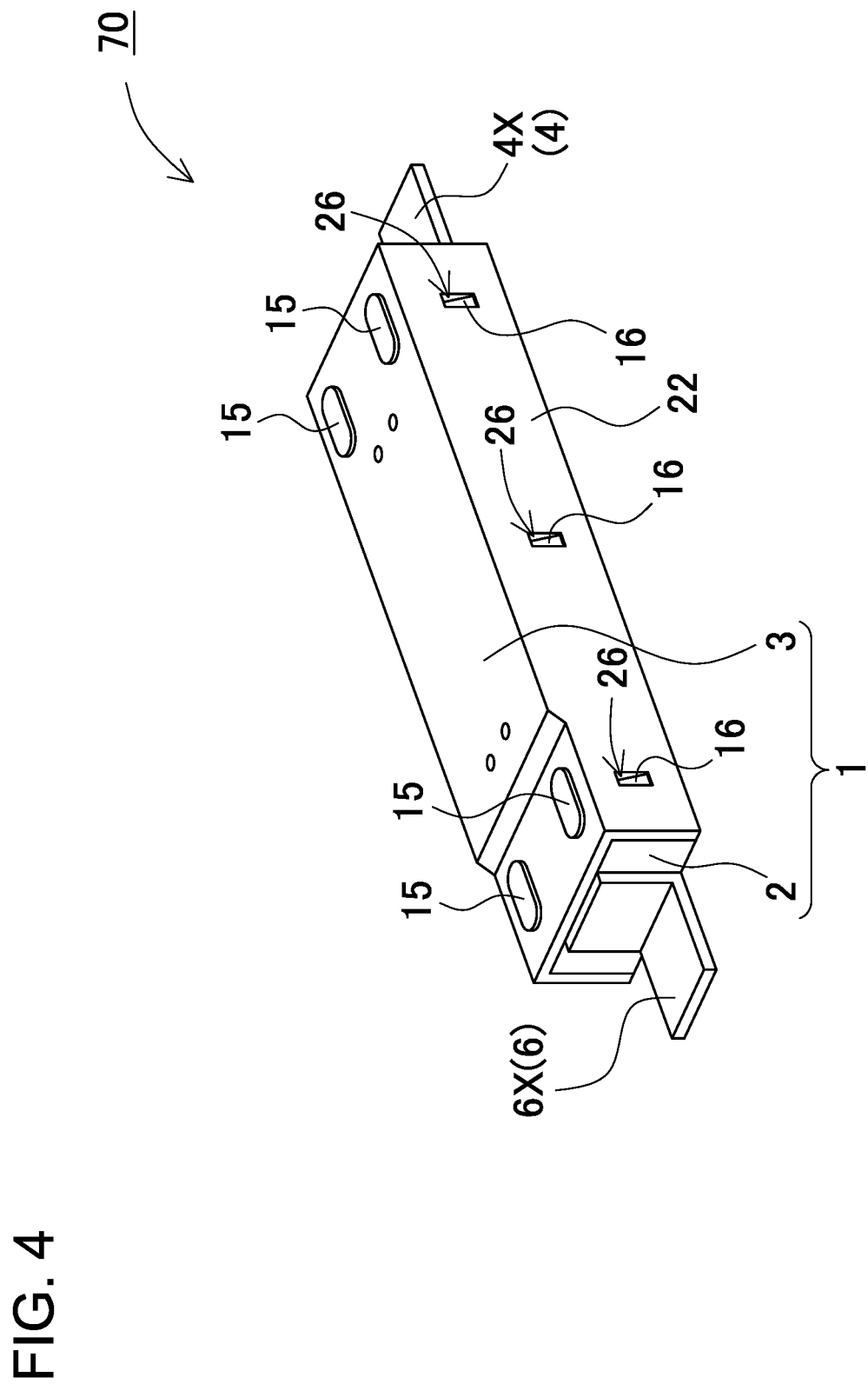
FIG. 4 is an oblique view of a circuit breaker for one embodiment of the present invention.
Figure 12:
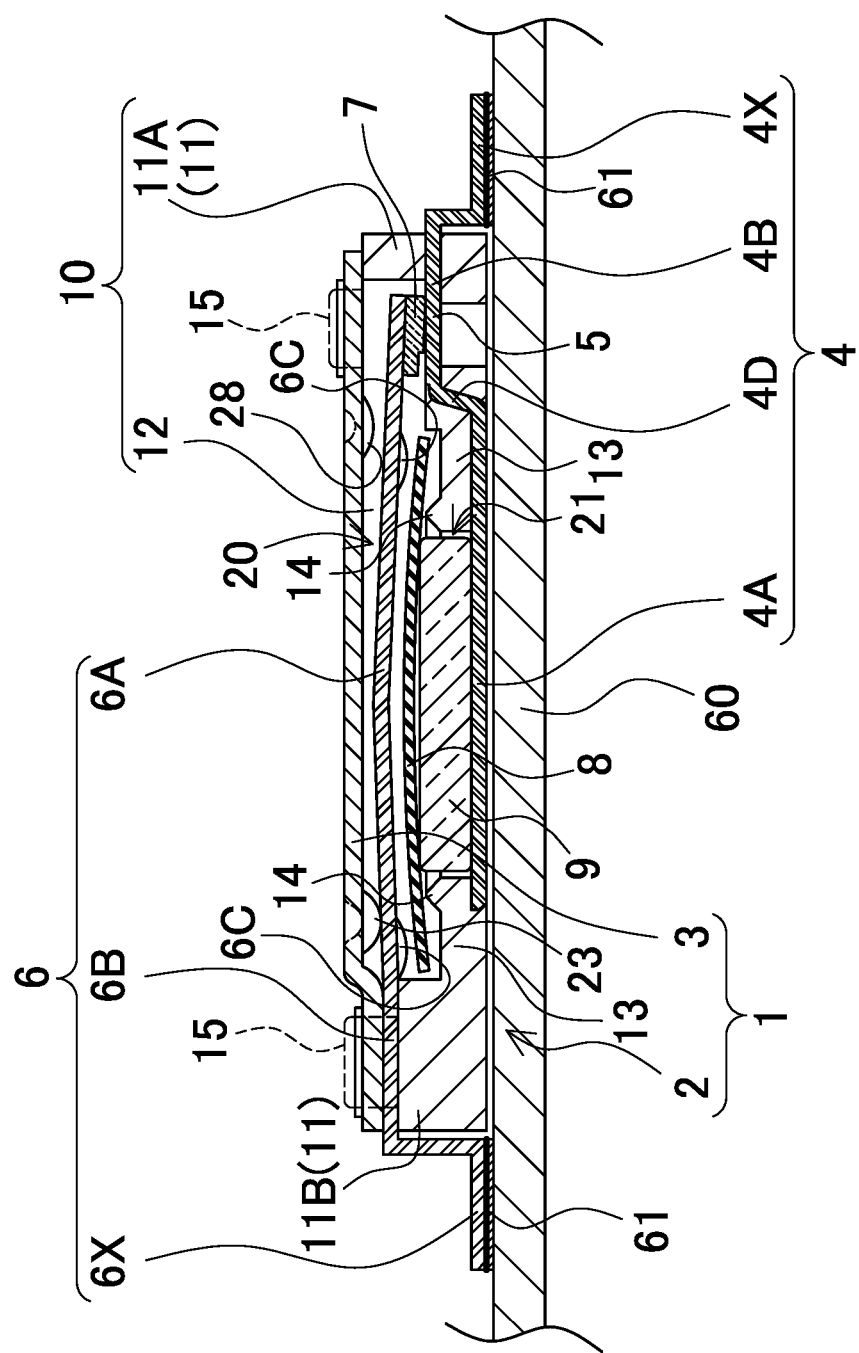
FIG. 12 is a cross-section view showing one example of the circuit breaker in FIG. 4 mounted on a circuit board.

As shown in FIG. 12, the circuit breaker shown in FIGS. 4-6 is mounted on a circuit board 60 by solder-attachment of the moving contact metal plate 6 connecting terminal 6X and stationary contact metal plate 4 connecting terminal 4X that extend from the ends of the external case 1. This circuit breaker is soldered in place with the bottom surface of the external case 1, which is the bottom surface of the insulating case 2, disposed opposite the surface of the circuit board 60. With the connecting terminals 4X, 6X, which extend from opposite ends of the external case 1, aligned on solder-pads 61, the circuit breaker is heated and reflow solder-attached to the circuit board 60. This not only connects the circuit breaker to the circuit board 60 solder-pads 61 via the connecting terminals 4X, 6X, but also mounts it in an aligned position on the circuit board 60.

Figure 13:
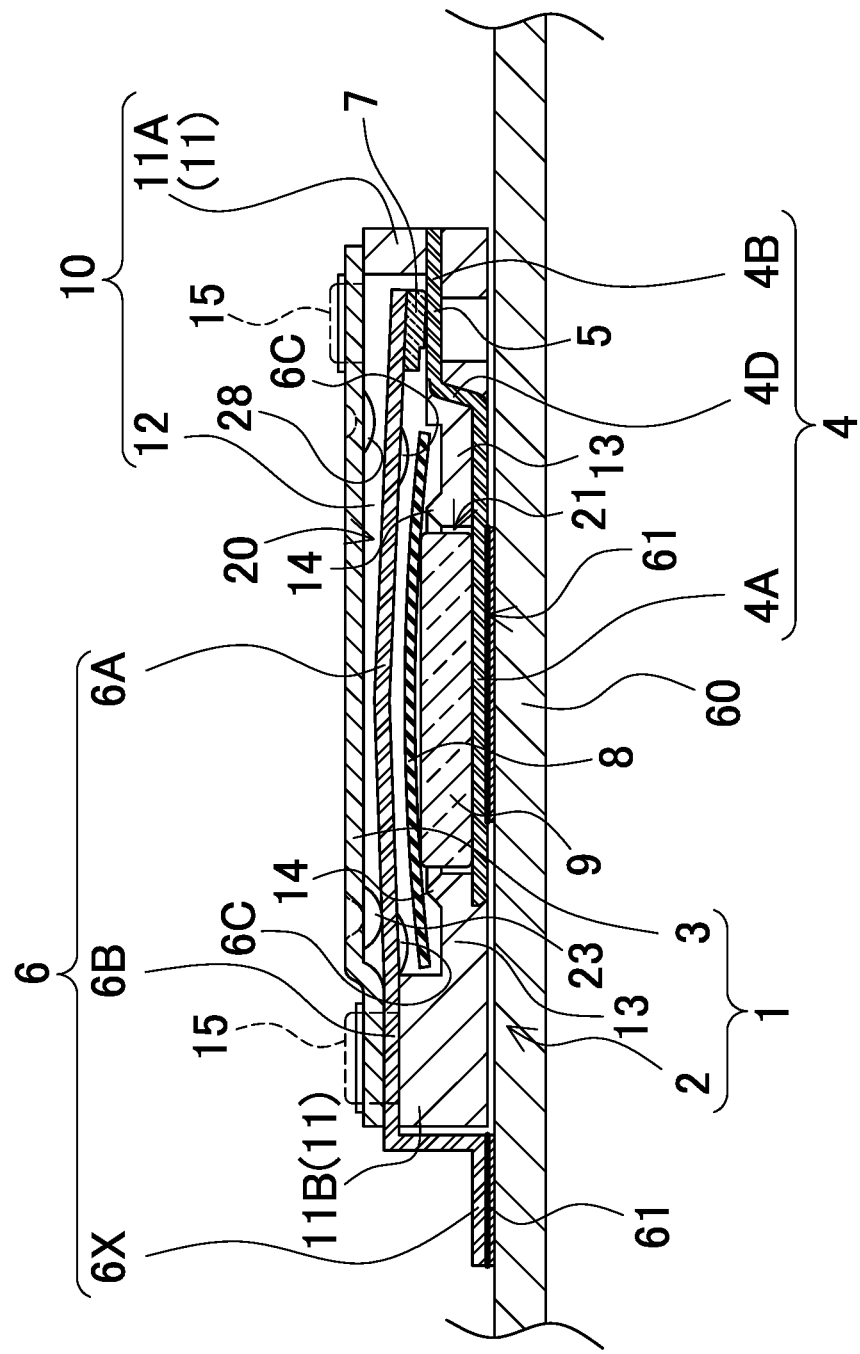
FIG. 13 is a cross-section view showing another example of the circuit breaker in FIG. 4 mounted on a circuit board.

Turning to the circuit breaker shown in FIG. 13, the moving contact metal plate 6 connecting terminal 6X extending from one end of the external case 1 and the exposed terminal 44, which is the region of the stationary contact metal plate 4 exposed from the bottom surface of the insulating case 2, are solder-attached to mount the circuit breaker on a circuit board 60. Since the exposed terminal 44 of the stationary contact metal plate 4 connects to the circuit board 60, the connecting terminal 4X shown in FIGS. 5 and 6 is cut off at the vertical broken line in those figures. This circuit breaker is also soldered in place with the bottom surface of the external case 1, which is the bottom surface of the insulating case 2, disposed opposite the surface of the circuit board 60. With the connecting terminal 6X, which extend from one end of the external case 1, and the exposed terminal 44, which is exposed from the bottom surface of the insulating case 2, aligned on solder-pads 61, the circuit breaker is heated and reflow solder-attached to the circuit board 60. This not only connects the circuit breaker to the circuit board 60 solder-pads 61 via the connecting terminal 6X and exposed terminal 44, but also mounts it in an aligned position on the circuit board 60.

Figure 14:
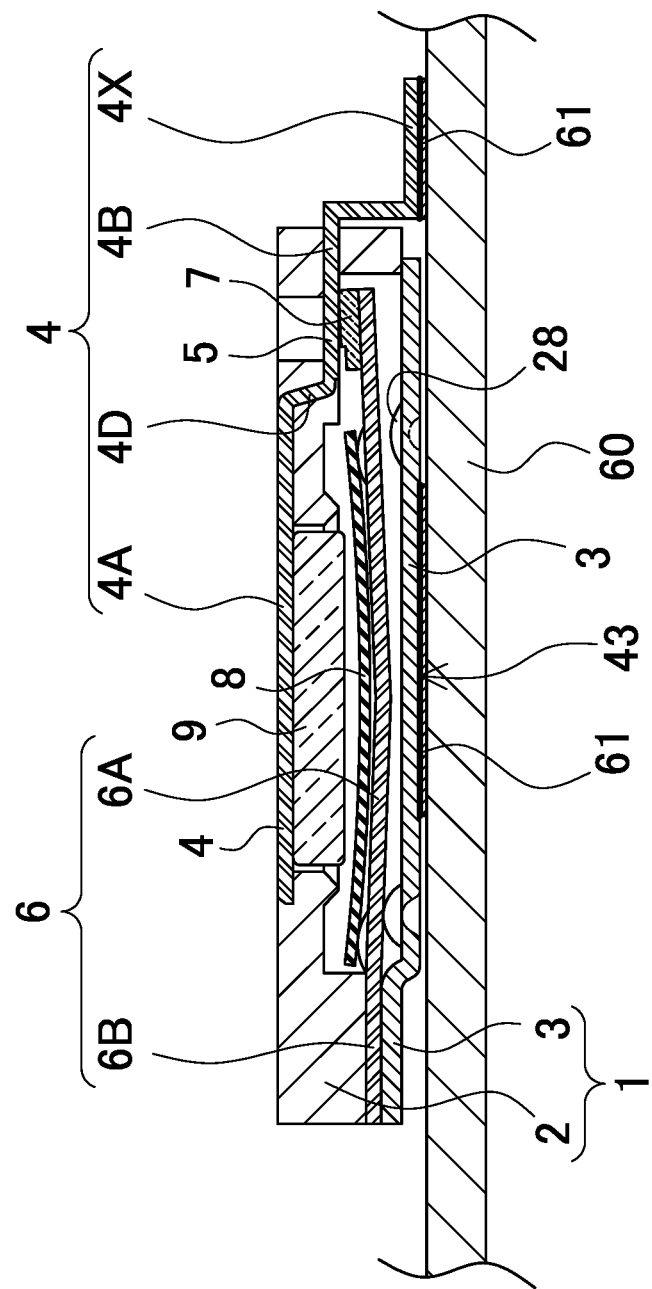
FIG. 14 is a cross-section view showing another example of the circuit breaker in FIG. 4 mounted on a circuit board.

Next, in the circuit breaker shown in FIG. 14, the stationary contact metal plate 4 connecting terminal 4X extending from one end of the external case 1 and the exposed terminal 43 of the external metal plate 3, which is stacked in electrical connection with the moving contact metal plate 6, are solder-attached to mount the circuit breaker on a circuit board 60. This circuit breaker is positioned on and solder-attached to the surface of the circuit board 60 in an orientation that is inverted compared to that of FIGS. 4-6. Accordingly, the stationary contact metal plate 4 connecting terminal 4X that extends out the end of the insulating case 2 is bent to position its connecting surface (i.e. bottom surface in FIG. 14) approximately in the same plane as the top of the external metal plate 3, which faces downward in FIG. 14. Since the exposed terminal 43 of the external metal plate 3 connects to the circuit board 60, the connecting terminal 6X shown in FIGS. 5 and 6 is cut off at the vertical broken line in those figures. This circuit breaker is heated and reflow solder-attached to the circuit board 60 with the connecting terminal 4X extending from one end of the external case 1 and the exposed terminal 43 of the external metal plate 3 disposed on solder-pads 61. This not only connects the circuit breaker to the circuit board 60 solder-pads 61 via the connecting terminal 4X and exposed terminal 43, but also mounts it in an aligned position on the circuit board 60.

Figure 15:
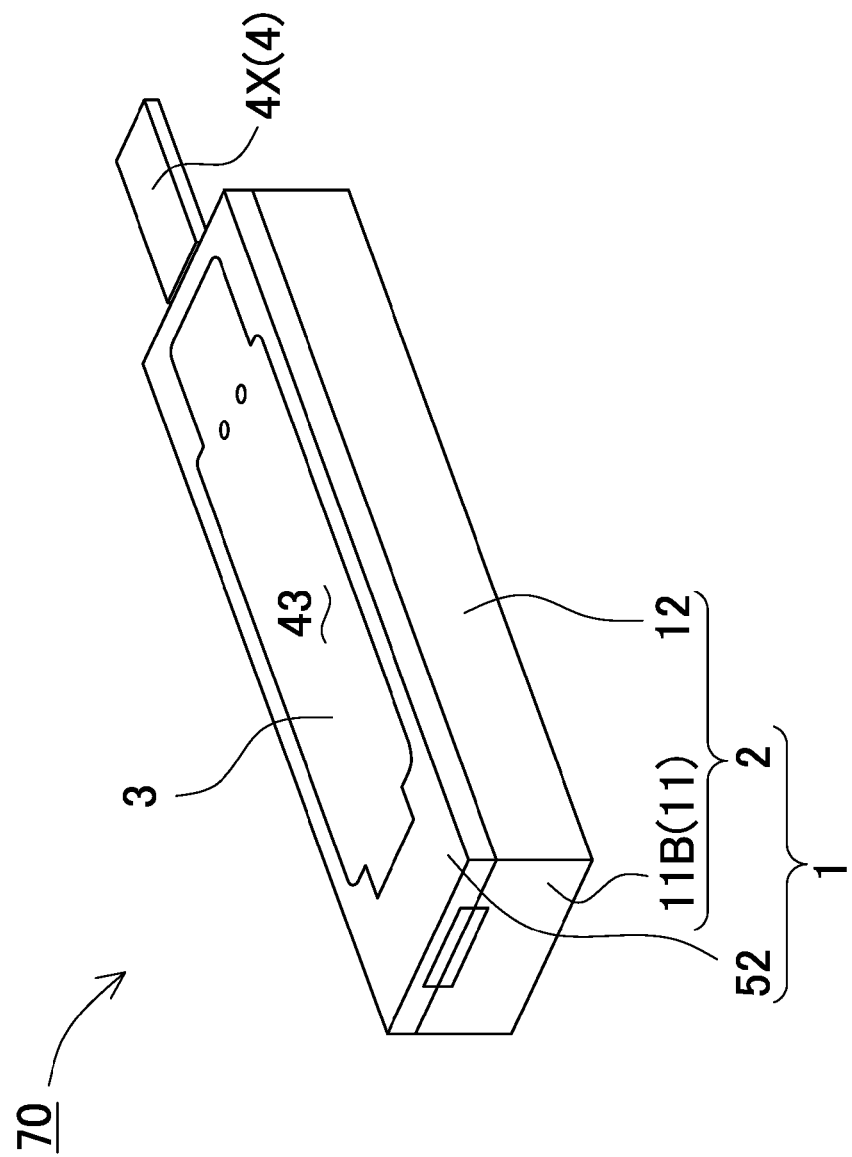
FIG. 15 is an oblique view of a circuit breaker for another embodiment of the present invention.
Figure 16:
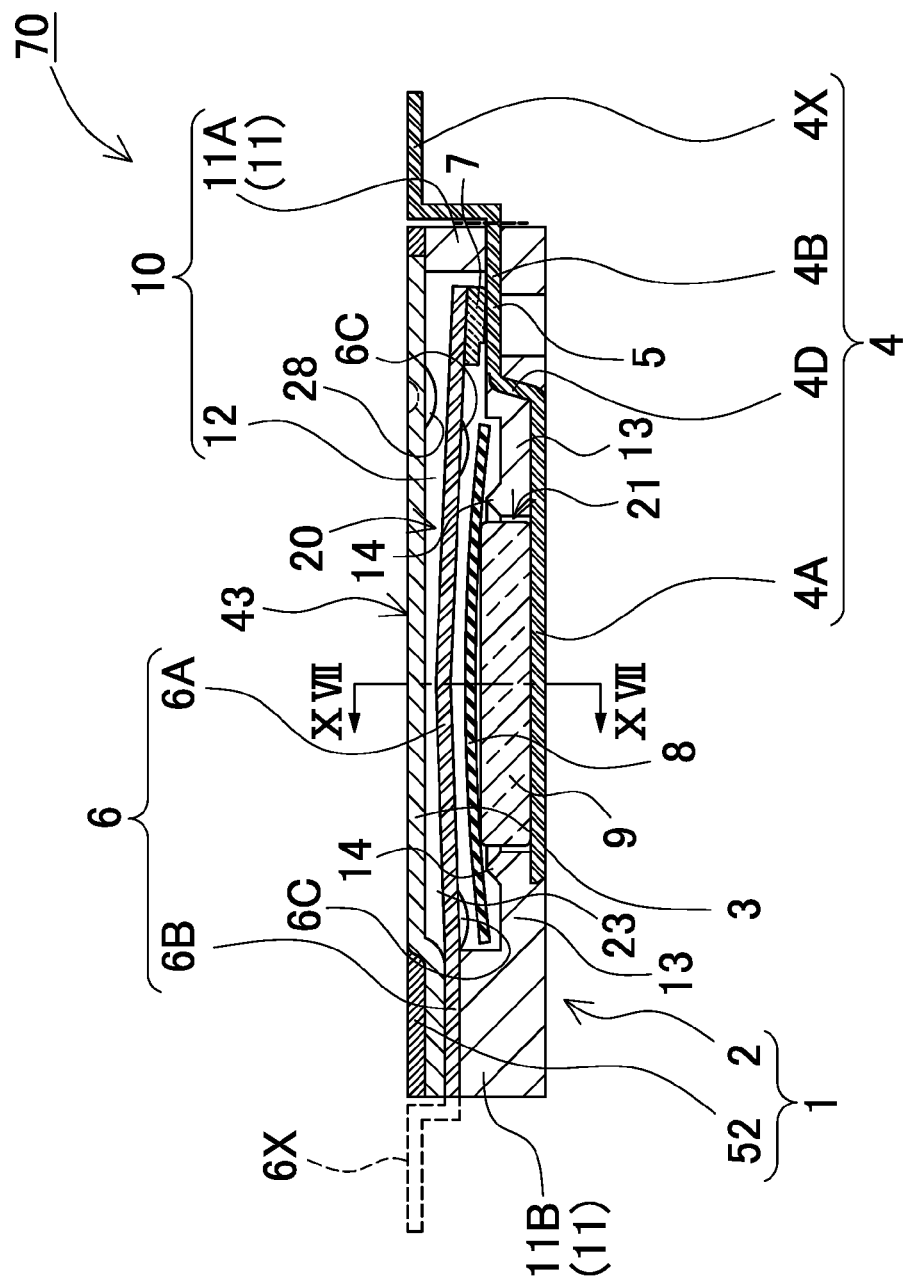
FIG. 16 is a vertical cross-section in the lengthwise direction through the circuit breaker shown in FIG. 15.
Figure 17:
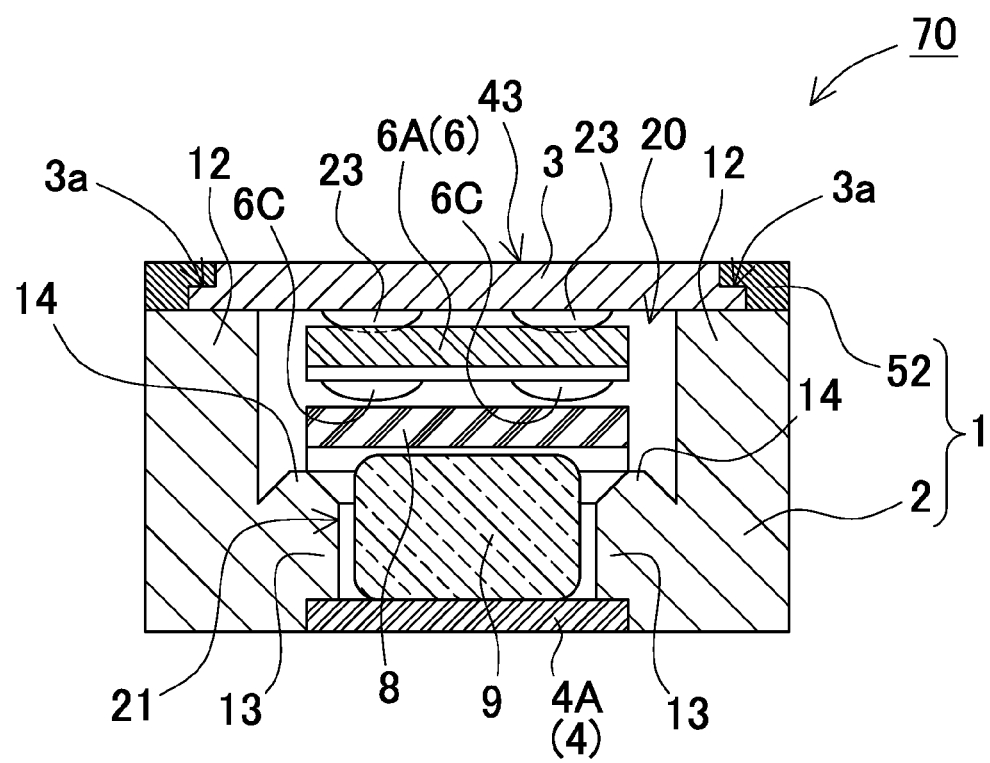
FIG. 17 is a cross-section view at the line XVII-XVII across the circuit breaker shown in FIG. 16.
Figure 18:
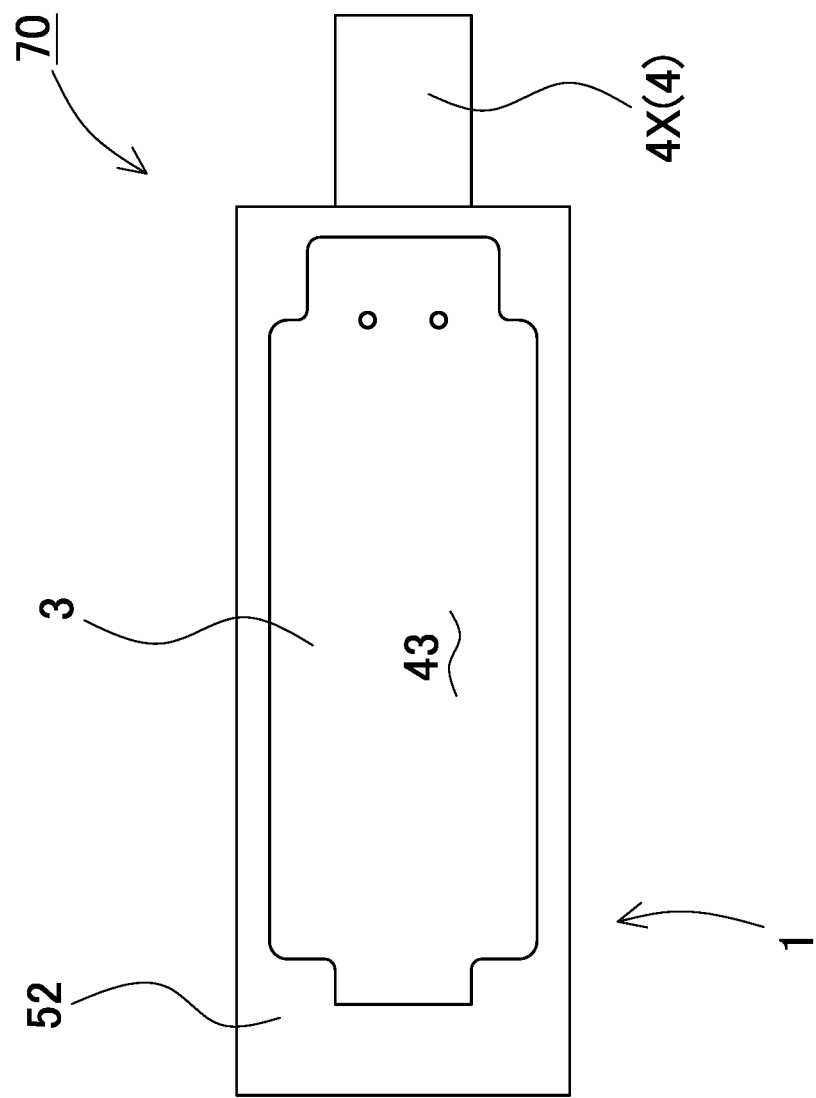
FIG. 18 is a plan view of the circuit breaker shown in FIG. 15.

The circuit breaker shown in FIGS. 15-18 has the external metal plate 3 embedded in binding plastic 52, and the binding plastic 52 is attached to the insulating case 2 to attach the external metal plate 3 to the insulating case 2. The external metal plate 3 is fixed in the binding plastic 52 by insertion-molding. Specifically, the external metal plate 3 is positioned in a molding cavity, and molten plastic is introduced into the mold cavity to fix the external metal plate 3 in binding plastic 52. The binding plastic 52 is attached to the insulating case 2 by ultrasonic welding to form the external case 1. However, the binding plastic 52 can also be attached to the insulating case 2 via bond-attachment or a snap-in-place configuration. The binding plastic 52 surrounds the external metal plate 3 and is attached to the top of the first end-wall 11A, second end-wall 11B, and opposing side-walls 12 of the insulating case 2. Except for the outer perimeter region, the external metal plate 3 is exposed and serves as the exposed terminal 43. As shown in FIGS. 15-17, the upper surfaces of the external metal plate 3 and the binding plastic 52 are coplanar. The exposed terminal 43 of this circuit breaker can reliably contact and connect to a circuit board solder-pad. Namely, the binding plastic 52 does not protrude beyond the exposed terminal 43 to separate it from the solder-pad, and the exposed terminal 43 can be connected to the solder-pad in a stable, reliable manner. To insure that the upper surfaces of the exposed terminal 43 and the binding plastic 52 are in the same plane, a step 3a (see FIG. 17) is established around the perimeter of the external metal plate 3, and binding plastic 52 is molded into that step 3a.

The end of the stationary contact metal plate 4 that extends outside the insulating case 2 serves as the connecting terminal 4X of the circuit breaker shown in FIGS. 15 and 16. To enable solder-attachment such as reflow solder-attachment of the stationary contact metal plate 4 connecting terminal 4X to the surface of a circuit board, the connecting surface (upper surface in FIG. 15) of the stationary contact metal plate 4 extending out the end of the external case 1 is bent to position it in approximately the same plane as the top of the external case 1, namely in the same plane as top of the external metal plate 3.

Figure 19:
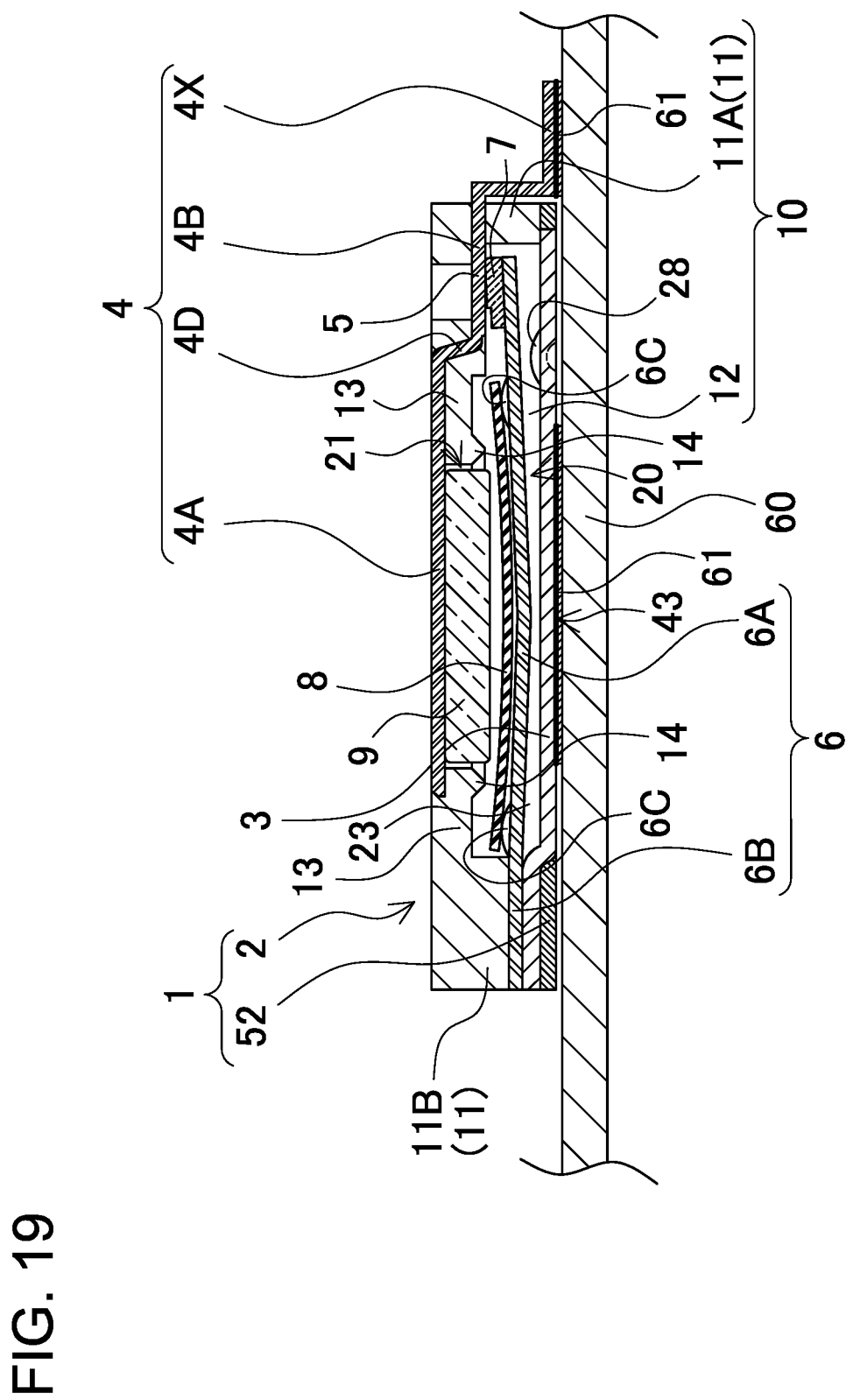
FIG. 19 is a cross-section view showing one example of the circuit breaker in FIG. 15 mounted on a circuit board.

As shown in FIG. 19, the circuit breaker is positioned on and solder-attached to the surface of the circuit board 60 in an orientation that is inverted compared to that of FIGS. 15-17. This circuit breaker is heated and reflow solder-attached to the circuit board 60 with the stationary contact metal plate 4 connecting terminal 4X, which extends from one end of the external case 1, and the exposed terminal 43 of the external metal plate 3, which is stacked in electrical contact with the moving contact metal plate 6, disposed on solder-pads 61. This not only connects the circuit breaker to the circuit board 60 solder-pads 61 via the connecting terminal 4X and exposed terminal 43, but also mounts the circuit breaker in an aligned position on the circuit board 60. However, as shown with a broken line outline in FIG. 16, the end of the moving contact metal plate 6 can also extend outside the external case 1 to establish the connecting terminal 6X, and the moving contact metal plate 6 connecting terminal 6X and stationary contact metal plate 4 connecting terminal 4X can be solder-attached to circuit board 60 solder-pads 61.

Figure 20:
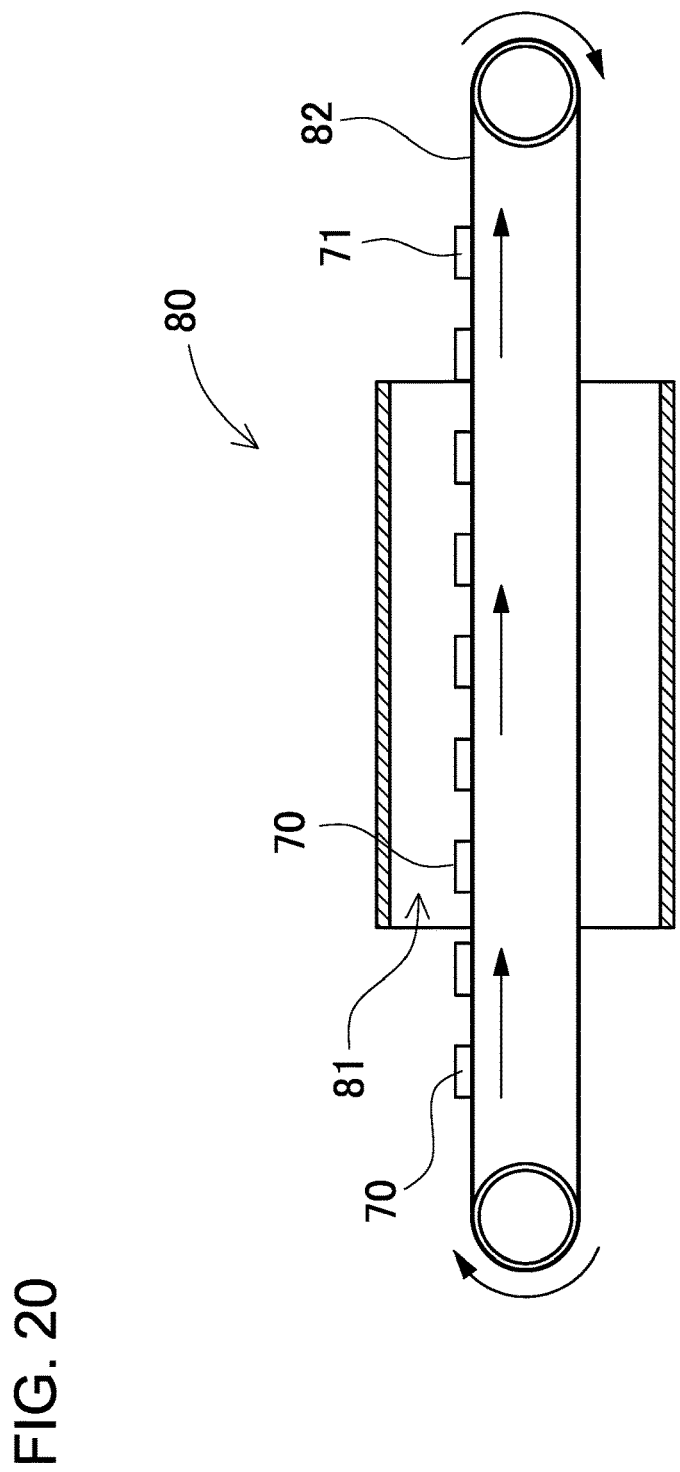
FIG. 20 is a schematic cross-section illustrating the circuit breaker assembly anneal process.

The circuit breaker described above is fabricated by an assembly step that makes a circuit breaker assembly 70 with the moving contact metal plate 6, the stationary contact metal plate 4, and the bimetallic strip 8 disposed in prescribed locations within the external case 1; and an anneal step that introduces the circuit breaker assembly 70 made in the assembly step into an anneal oven 80 (as shown in FIG. 20), heats the circuit breaker assembly 70 in the anneal oven 80 and subsequently cools the circuit breaker assembly 70 to anneal both the moving contact metal plate 6 and the bimetallic strip 8 and produce a heat-treated circuit breaker 71.

The circuit breaker assembly 70 made in the assembly step is annealed in the anneal step to form the heat-treated circuit breaker as the finished product.

Figure 25:
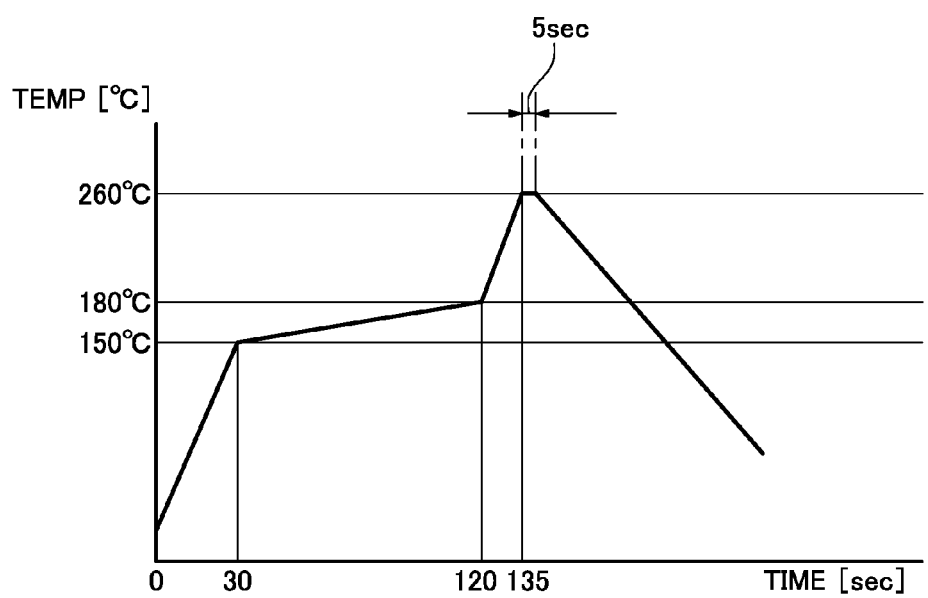
FIG. 25 is a graph showing thermal environment temperature vs. time characteristics for detecting change in the circuit breaker reset temperature.

In the anneal step, the circuit breaker assembly 70 is heated in the anneal oven 80 for 5 sec to 60 sec in a surrounding temperature from 180° C. to 270° C. After the anneal step, the change in reset temperature of the heat-treated circuit breaker 71 is required to be within 5° C. and preferably within 4° C. FIG. 25 shows the temperature vs. time characteristics of the thermal environment within the heating apparatus. In this thermal environment, temperature rises from room temperature ambient to 150° C. within 30 sec, rises from 150° C. to 180° C. over 90 sec, rises from 180° C. to 260° C. in 15 sec, soaks at 260° C. for 5 sec, and subsequently exits the heating apparatus for cooling at room temperature.

To produce a circuit breaker with reset temperature change after the heat-treatment described above within 5° C. and preferably within 4° C., the surrounding temperature inside the anneal oven 80 is preferably 180° C. to 270° C., more preferably 200° C. to 250° C., and optimally 220° C. to 240° C. If anneal oven 80 temperature is too low, annealing is under-effective, and after solder reflow, the reset temperature is reduced in an inconsistent manner. Conversely, If anneal oven 80 temperature is too high, the range in reset temperatures widens even before solder reflow, and when only circuit breakers having a reset temperature within a given range are selected, the reject rate is high. Accordingly, optimal temperature ranges for annealing the circuit breaker assembly 70 in the anneal oven 80 are set as described above to minimize out-of-range reset temperature rejects after the anneal step, and to maintain the post-reflow solder-attach reset temperature within a given range.

As shown in FIG. 20, circuit breaker assemblies 70 are transported into the heating tunnel 81 of the anneal oven 80 on a conveyor belt 82, heated inside the heating tunnel 81, and cooled after exit from the anneal oven 80 to complete the anneal step. This system can control the time-at-temperature of a circuit breaker assembly 70 by controlling conveyor belt 82 speed and heating tunnel 81 length. Heating time can be increased by reducing the speed of the conveyor belt 82 and lengthening the heating tunnel 81. Excluding the entrance and exit regions of the heating tunnel 81, the center region of the anneal oven 80 heating tunnel 81 heats circuit breaker assemblies 70 with a surrounding temperature of 180° C. to 270° C. Circuit breaker assemblies 70 are heated during passage through the center heating region and cooled after exit from the heating tunnel 81. Circuit breaker assembly 70 heating time during passage through the center region of the heating tunnel 81 is 5 sec or more, preferably 10 sec or more, and more preferably 15 sec or more. The longer the circuit breaker assembly 70 is heated, the more internal components are heated and the higher the actual temperature attained by the moving contact metal plate and bimetallic strip. Accordingly, the circuit breaker assembly 70 moving contact metal plate and bimetallic strip are annealed for a short time with high temperature inside the anneal oven 80, or for a longer time at a lower temperature. Further, the anneal step is not limited to the method described here, and other techniques such as batch-processing are also possible.

Figure 21:
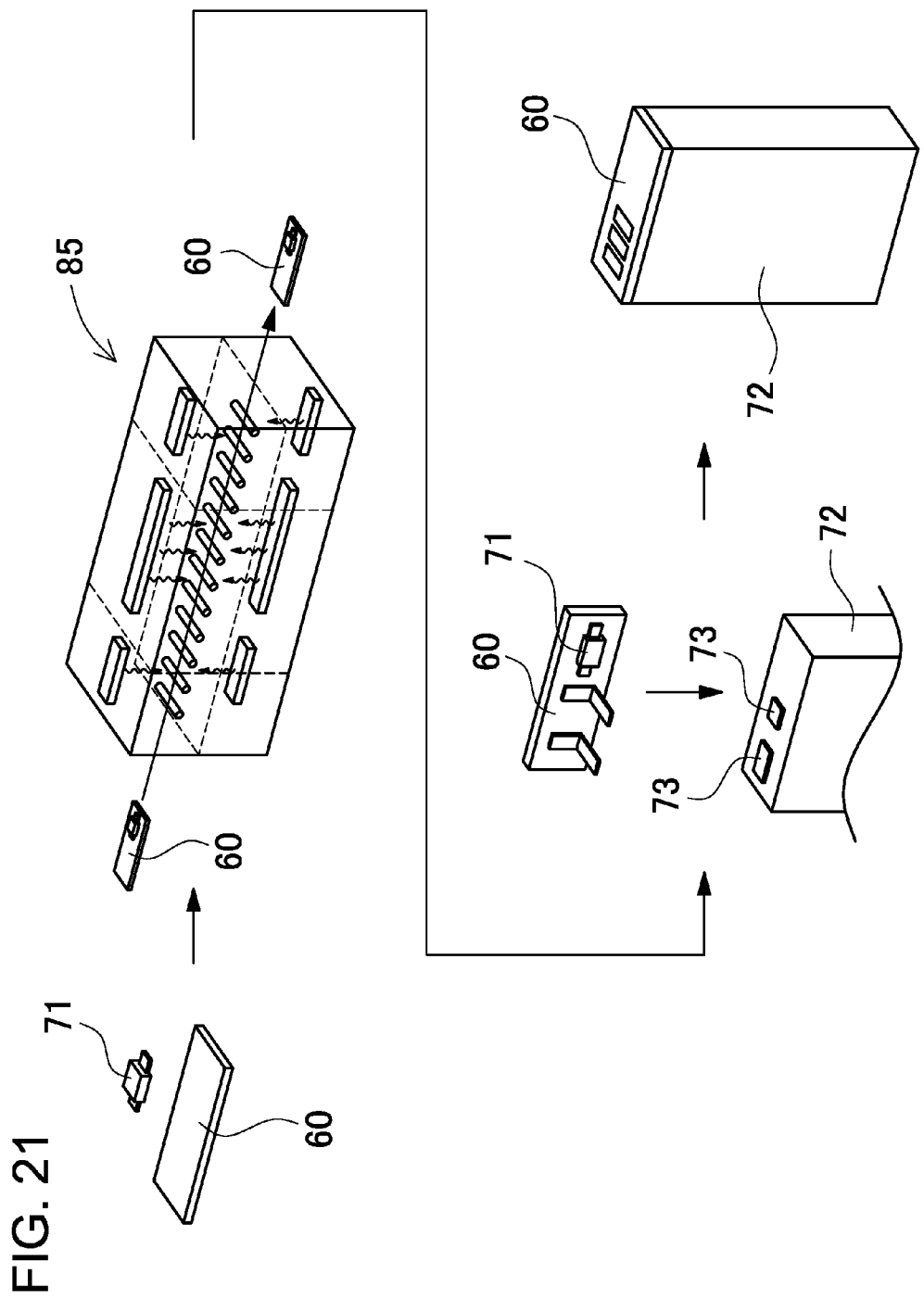
FIG. 21 is a schematic diagram showing the process-flow steps for battery pack assembly.

The heat-treated circuit breaker 71 annealed in the anneal step is assembled into a battery pack by the assembly sequence illustrated in FIG. 21. In the solder reflow step of this figure, the heat-treated circuit breaker 71 is disposed in a prescribed location on a circuit board 60 and transported into a reflow oven 85. The circuit board 60 is heated in the reflow oven 85 to solder-attach the circuit breaker to the circuit board 60. As shown in the exploded oblique view of FIG. 22, the circuit board 60 carrying the solder-attached heat-treated circuit breaker 71 is electrically connected by simultaneously spot-welding a pair of leads 63 connected to the circuit board 60 to positive and negative battery 72 terminals 73. This implements the electrical connection step to produce a finished battery pack.

Figure 23:
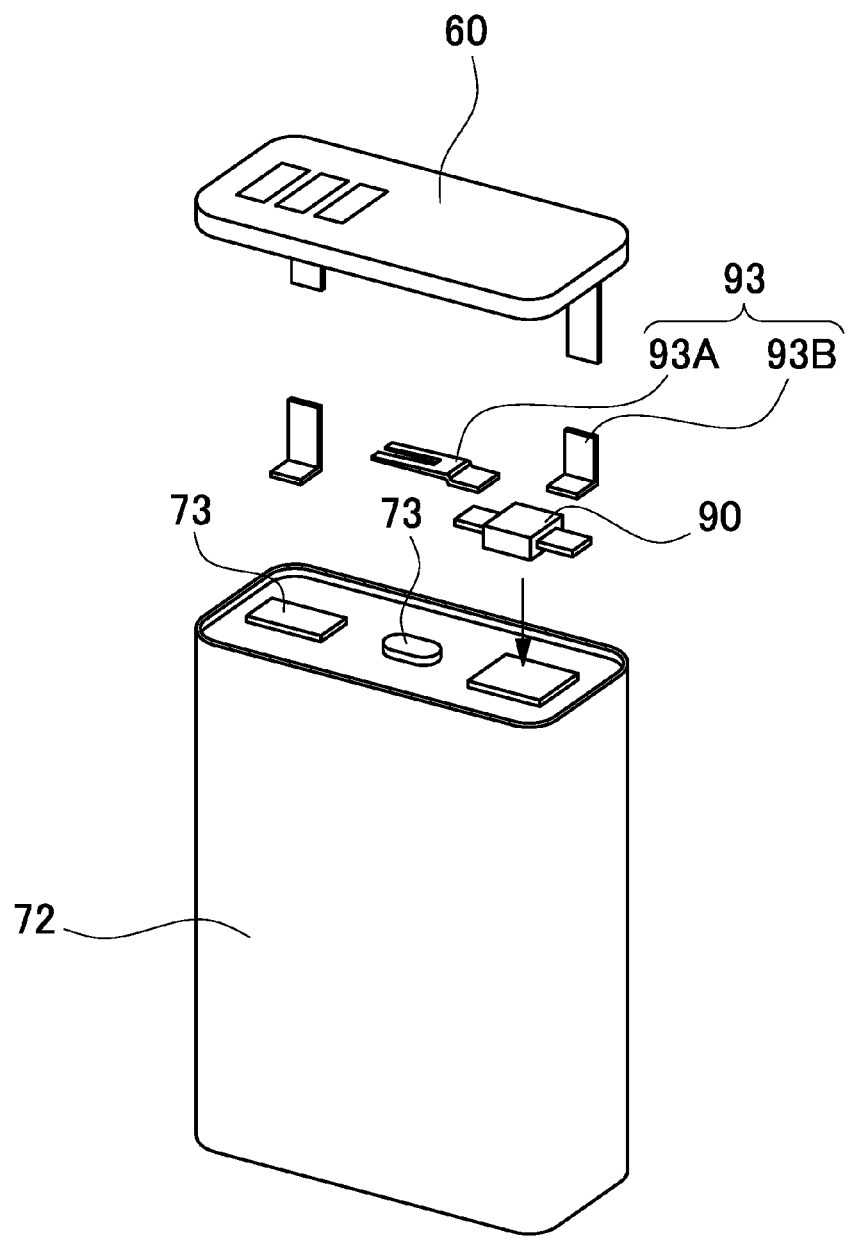
FIG. 23 is an exploded oblique view showing one example of a related-art battery pack.
Figure 24:
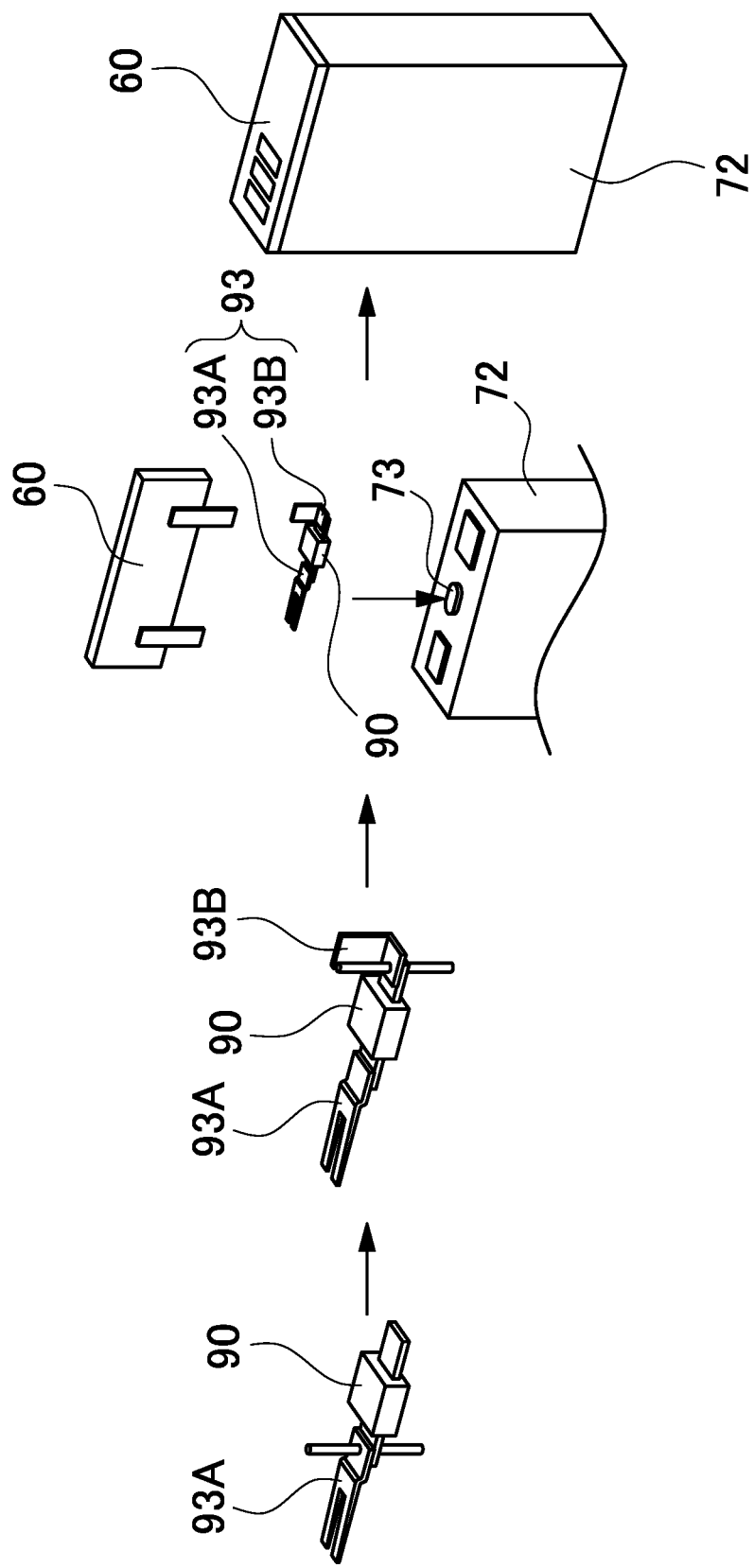
FIG. 24 is a schematic diagram showing the process-flow steps for assembly of the battery pack shown in FIG. 23.

Turning to the exploded oblique view of FIG. 23, an alternate example is shown where the circuit breaker is not mounted on the circuit board, but rather the battery pack is assembled by connecting the circuit board 60 to the battery 72 via the circuit breaker 90. This battery pack is assembled by the process flow illustrated in FIG. 24. This assembly process spot-welds nickel lead-plates 93 to each terminal of the circuit breaker 90, subsequently spot-welds one lead-plate 93A to a battery 72 terminal 73, and spot-welds or solder-attaches the other lead-plate 93B to the circuit board 60.

Figure 22:
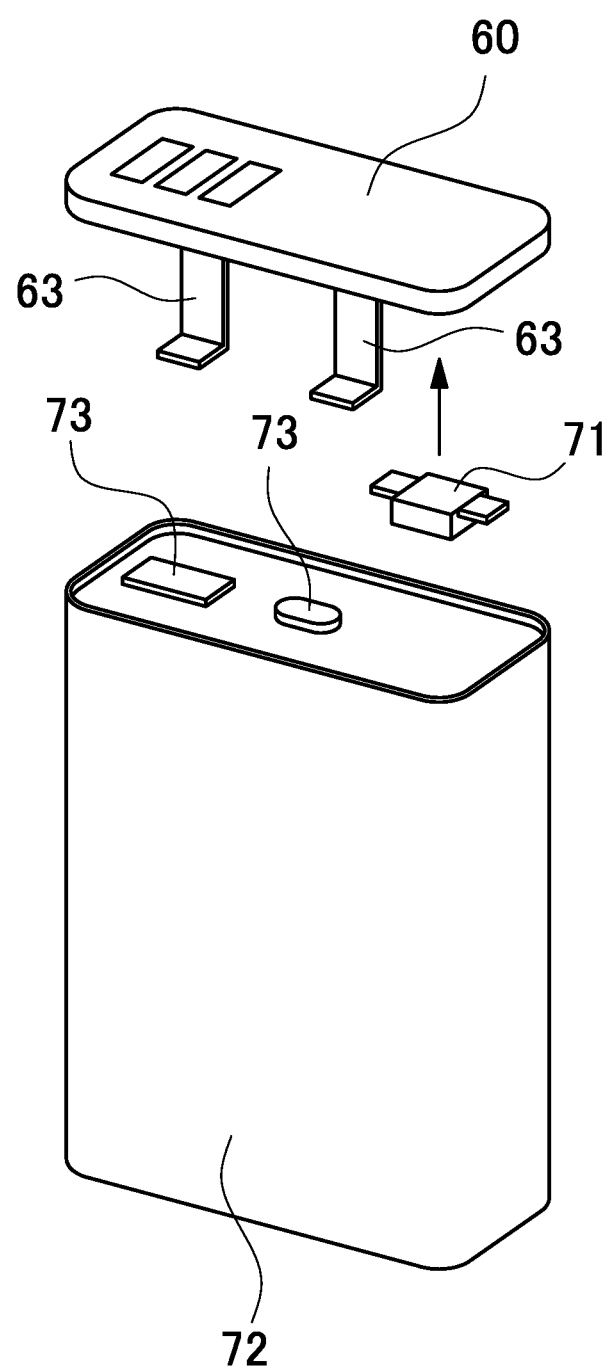
FIG. 22 is an exploded oblique view showing one example of a battery pack manufactured by a method for an embodiment of the present invention.

In comparison, the battery pack in FIG. 22 can be assembled by mounting the heat-treated circuit breaker 71 on a circuit board 60 in the solder reflow step illustrated in FIG. 21 and simultaneously spot-welding a pair of leads 63 on the circuit board 60 to positive and negative battery 72 terminals 73. Consequently, the battery pack shown in FIG. 22 can assembled with cost reduction compared to the battery pack shown in FIG. 23 and can be produced in quantity at low cost. In addition, the battery pack shown in FIG. 22 reduces the number of leads (lead-plates) from three to two enabling a parts-cost reduction.

First Embodiment

A circuit breaker assembly 70 having the structure shown in FIGS. 4-9 was fabricated with a moving contact metal plate 6 using a Cu—Ni—Si system alloy including Mg and Cr. In the anneal step, the circuit breaker assembly 70 was introduced into the heating tunnel 81 of the anneal oven 80 shown in FIG. 20, heated with an oven center region temperature of 230° C. over a 30 sec heating tunnel 81 transit time, subsequently discharged from the heating tunnel 81 via the conveyor belt 82, and cooled to complete the anneal and produce a heat-treated circuit breaker 71. The Cu—Ni—Si system alloy including Mg and Cr used in this first embodiment had the following composition.

Cu 96.15 mass %
Ni 2.3 mass %
Si 0.65 mass %
Sn 0.15 mass %
Zn 0.5 mass %
Mg 0.1 mass %
Cr 0.15 mass %

Ten circuit breakers fabricated by the method of the first embodiment had little reduction in reset temperature after the solder reflow step, and reset temperature showed little inconsistency as well. Measurements were made with a 1° C./min rate of temperature rise to determine temperature Ta when the contacts switched to the OFF-state, and subsequently a 1° C./min rate of cooling to determine temperature Tb when the contacts switched to the ON-state. After initial measurement of Ta and Tb, the circuit breakers were heated in an oven at 260° C. for 5 sec (simulating solder reflow). Next, circuit breakers taken from the oven were measured by raising the temperature at a rate of 1° C./min until the contacts switched to the OFF-state, and subsequently cooling at rate of 1° C./min to determine temperature Tb' when the contacts switched to the ON-state. Annealed and un-annealed circuit breakers were compared. Circuit breakers annealed via the anneal step had an average reset temperature of 45° C. with a minimum reset temperature of 43° C. In contrast, un-annealed circuit breakers had an average reset temperature of 43° C., and half of the circuit breakers had a reset temperature less than or equal to 43° C. In this embodiment, the entire sample of ten circuit breakers had reset temperature greater than or equal to 43° C. However, when a large quantity of circuit breakers are fabricated and circuit breakers with a reset temperature less than or equal to 43° C. are inevitably produced, circuit breakers can be selected after the anneal step to reject, for example, those with a reset temperature less than or equal to a prescribed value such as 43° C. This procedure can further insure within-specification reset temperature for heat-treated circuit breakers 71.

Although the circuit breaker in the above embodiment uses flexible metal plate Cu—Ni—Si system alloy including Mg and Cr as the moving contact metal plate 6, the circuit breaker fabrication method of the present invention is not limited to a moving contact metal plate using that type of flexible metal plate. For example, flexible metal plate such as copper material that includes Sn and P, flexible metal plate copper material that includes Ni, P, Zn, and Fe, or flexible metal plate copper material that includes Fe, P, and Zn can also be used to limit reduction and scatter in the distribution of reset temperatures after the solder reflow step.

INDUSTRIAL APPLICABILITY

The present invention can be advantageously adopted to produce a circuit breaker that can reduce scatter in the post-thermal-excursion distribution of reset temperatures for switching to the ON-state, and can be used to advantage in a method of manufacturing a battery pack housing that circuit breaker.

What is claimed is:

1. A method of manufacturing a circuit breaker comprising:
   a stationary contact metal plate having a stationary contact;
   a moving contact metal plate that is a flexible metal plate, which has a moving contact disposed in a position opposite the stationary contact, and which resiliently presses the moving contact against the stationary contact;
   a bimetallic strip that changes shape with temperature and is disposed in a position to switch the moving contact metal plate ON and OFF; and
   an external case that houses the stationary contact on the stationary contact metal plate and the moving contact on the moving contact metal plate and also contains the bimetallic strip,
   the method comprising:
   an assembly step to make a circuit breaker assembly with the moving contact metal plate, the stationary contact metal plate, and the bimetallic strip disposed in prescribed locations within the external case; and
   an anneal step that introduces the circuit breaker assembly made in the assembly step into an anneal oven, heats the circuit breaker assembly in the anneal oven and subsequently cools the circuit breaker assembly to anneal both the moving contact metal plate and the bimetallic strip and produce a heat-treated circuit breaker.

2. The method of manufacturing a circuit breaker as cited in claim 1 wherein flexible metal plate Cu—Ni—Si system alloy including Mg and Cr is used as the moving contact metal plate.

3. The method of manufacturing a circuit breaker as cited in claim 1 wherein flexible copper metal plate material including Sn and P is used as the moving contact metal plate.

4. The method of manufacturing a circuit breaker as cited in claim 1 wherein flexible copper metal plate material including Ni, P, Zn, and Fe is used as the moving contact metal plate.

5. The method of manufacturing a circuit breaker as cited in claim 1 wherein flexible copper metal plate material including Fe, P, and Zn is used as the moving contact metal plate.

6. The method of manufacturing a circuit breaker as cited in claim 1 wherein in the anneal step, the circuit breaker assembly is heated in the anneal oven with a surrounding temperature greater than or equal to 180° C. and less than or equal to 270° C.

7. The method of manufacturing a circuit breaker as cited in claim 1 wherein in the anneal step, the surrounding temperature for annealing the circuit breaker assembly in the anneal oven is a temperature from 180° C. to 270° C. with heating for 5 sec to 60 sec, and that anneal temperature is such that the change in reset temperature after the anneal step is within 5° C.

8. The method of manufacturing a circuit breaker as cited in claim 7 wherein in the anneal step, the surrounding temperature for annealing the circuit breaker assembly in the anneal oven is a temperature from 180° C. to 270° C. with heating for 5 sec to 60 sec, and that anneal temperature is such that the change in reset temperature after the anneal step is within 4° C.

9. The method of manufacturing a circuit breaker as cited in claim 1 wherein in the anneal step, the anneal oven heats the circuit breaker assembly in an oxidizing atmosphere.

10. The method of manufacturing a circuit breaker as cited in claim 1 wherein in the anneal step, the anneal oven heats the circuit breaker assembly in an oxidizing atmosphere and heating is at a temperature that forms an oxide layer on surfaces of the moving contact metal plate.

11. The method of manufacturing a circuit breaker as cited in claim 1 wherein an external metal plate with an exposed surface is established in the external case, the external metal plate is attached with surface-to-surface contact in a thermally coupled manner to the moving contact metal plate in the assembly step, and the anneal oven heats the moving contact metal plate via the external metal plate when the circuit breaker assembly is annealed in the anneal step.

12. A method of manufacturing a battery pack, the method comprising:
an assembly step to form a circuit breaker assembly having a stationary contact metal plate with a stationary contact; a moving contact metal plate that is a flexible metal plate, which has a moving contact disposed in a position opposite the stationary contact, and which resiliently presses the moving contact against the stationary contact; a bimetallic strip disposed in a position to switch the moving contact metal plate ON and OFF; and an external case that houses those components and disposes the stationary contact on the stationary contact metal plate and bimetallic strip in fixed positions;
an anneal step that introduces the circuit breaker assembly made in the assembly step into an anneal oven, heats the circuit breaker assembly to anneal both the moving contact metal plate and the bimetallic strip and produce a heat-treated circuit breaker;
a solder reflow step that places the heat-treated circuit breaker annealed in the anneal step in a prescribed location on a circuit board, and heats the heat-treated circuit breaker in a solder reflow oven to solder-attach it to the circuit board; and
an electrical connection step to electrically connect the circuit board carrying the heat-treated circuit breaker mounted in the solder reflow step to one or more batteries.

13. The method of manufacturing a battery pack as cited in claim 12 wherein flexible metal plate Cu—Ni—Si system alloy including Mg and Cr is used as the moving contact metal plate.

14. The method of manufacturing a battery pack as cited in claim 12 wherein flexible copper metal plate material including Sn and P is used as the moving contact metal plate.

15. The method of manufacturing a battery pack as cited in claim 12 wherein flexible copper metal plate material including Ni, P, Zn, and Fe is used as the moving contact metal plate.

16. The method of manufacturing a battery pack as cited in claim 12 wherein flexible copper metal plate material including Fe, P, and Zn is used as the moving contact metal plate.

17. The method of manufacturing a battery pack as cited in claim 12 wherein the surrounding temperature for heating the circuit breaker assembly in the anneal oven in the anneal step is set lower than the surrounding temperature in the solder reflow oven.

18. The method of manufacturing a battery pack as cited in claim 12 wherein the anneal oven heating temperature in the anneal step is greater than or equal to 180° C. and less than or equal to 270° C.

19. The method of manufacturing a battery pack as cited in claim 12 wherein in the anneal step, the surrounding temperature for annealing the circuit breaker assembly in the anneal oven is a temperature from 180° C. to 270° C. with heating for 5 sec to 60 sec, and that anneal temperature is such that the change in reset temperature after the anneal step is within 5° C.

20. The method of manufacturing a battery pack as cited in claim 19 wherein in the anneal step, the surrounding temperature for annealing the circuit breaker assembly in the anneal oven is a temperature from 180° C. to 270° C. with heating for 5 sec to 60 sec, and that anneal temperature is such that the change in reset temperature after the anneal step is within 4° C.

* * * * *